(12) United States Patent
Hutzler

(10) Patent No.: US 9,608,082 B2
(45) Date of Patent: Mar. 28, 2017

(54) ELECTRO-MECHANICAL SWITCHING DEVICES

(71) Applicant: Infineon Technologies AG, Neubiberg (DE)

(72) Inventor: Michael Hutzler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/788,222

(22) Filed: Jun. 30, 2015

(65) Prior Publication Data

US 2017/0005172 A1 Jan. 5, 2017

(51) Int. Cl.
| | | |
|---|---|---|
| *H01L 29/66* | (2006.01) | |
| *H01L 29/76* | (2006.01) | |
| *H01L 31/062* | (2012.01) | |
| *G01P 15/08* | (2006.01) | |
| *H01L 29/423* | (2006.01) | |
| *B81B 3/00* | (2006.01) | |
| *H01L 27/088* | (2006.01) | |

(52) U.S. Cl.
CPC ........ *H01L 29/4236* (2013.01); *B81B 3/0086* (2013.01); *H01L 27/088* (2013.01)

(58) Field of Classification Search
CPC .. H01L 29/4236; H01L 27/088; B81B 3/0086
USPC ... 257/334, 288, E21.13, 292, E21.629, 417, 257/E21.49; 438/270, 587, 237, 597, 59, 438/492; 365/63
See application file for complete search history.

(56) References Cited

U.S. PATENT DOCUMENTS

| | | | | |
|---|---|---|---|---|
| 6,388,299 B1* | 5/2002 | Kang | ...................... | H01L 29/84 257/415 |
| 2005/0023929 A1* | 2/2005 | Fujita | ..................... | H02N 1/008 310/309 |
| 2005/0227428 A1* | 10/2005 | Mihai | ................... | B81B 3/0021 438/222 |
| 2008/0277718 A1* | 11/2008 | Ionescu | .................. | B82Y 10/00 257/324 |
| 2009/0128221 A1* | 5/2009 | Kam | ..................... | B82Y 10/00 327/434 |
| 2009/0321793 A1* | 12/2009 | Ollier | .................. | G01P 15/0802 257/254 |
| 2012/0212289 A1* | 8/2012 | Kothari | ................. | H01L 29/515 327/581 |

OTHER PUBLICATIONS

Clarke, "IBM, ST Go Back to the Future with Nanorelay Logic" EE Times, [Online.] Available: http://www.eetimes.com/electronics-news/4395239/IBM-ST-research-micro-relay-logic, Sep. 4, 2012, 2 pages.

(Continued)

*Primary Examiner* — Long K Tran
*Assistant Examiner* — Dzung Tran
(74) *Attorney, Agent, or Firm* — Slater Matsil, LLP

(57) ABSTRACT

A switching device includes an opening disposed in a substrate. A source is disposed adjacent the opening and has a contact surface parallel to sidewalls of the opening. A drain is disposed adjacent the opening and has a contact surface parallel to the sidewalls of the opening. A moveable gate stack includes a channel and a gate. The moveable gate stack is disposed within the opening.

32 Claims, 32 Drawing Sheets

(56) References Cited

OTHER PUBLICATIONS

Despont, et al., "Nano-Electro-Mechanical Integration and Computation," CMI MicroNanoFabrication Annual Review Meeting, EPFL, Lausanne, Switzerland, May 7, 2013, 2 pgs.
Nathanael, et al., "4-Terminal Relay Technology for Complementary Logic," IEEE International Electron Devices Meeting (IEDM), Dec. 7, 2009, pp. 223-226.
Spencer, et al., "Demonstration of Integrated Micro-Electro-Mechanical Relay Circuits for VLSI Applications," IEEE Journal of Solid-State Circuits, vol. 46, No. 1, Jan. 2011, pp. 308-320.
Steeneken, et al., "Performance Limits of MEMS Switches for Power Electronics," Proceedings of the 2012 24th International Symposium on Power Semiconductor Devices and ICs Jun. 3-7, 2012—Bruges, Belgium, pp. 417-421.

\* cited by examiner

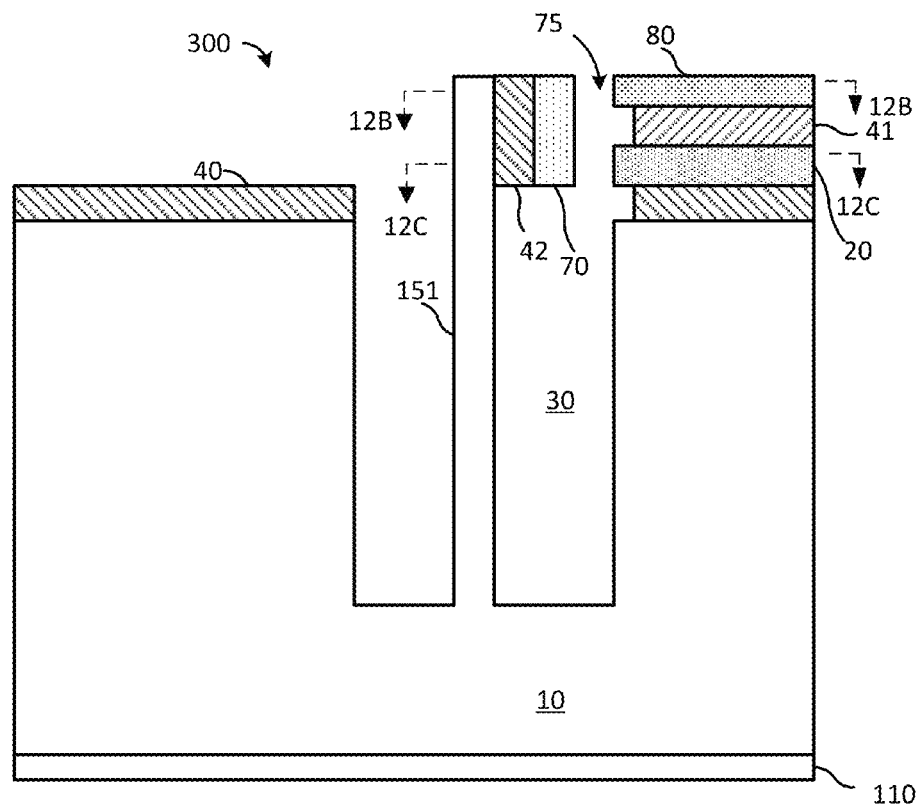
*Fig. 12A*
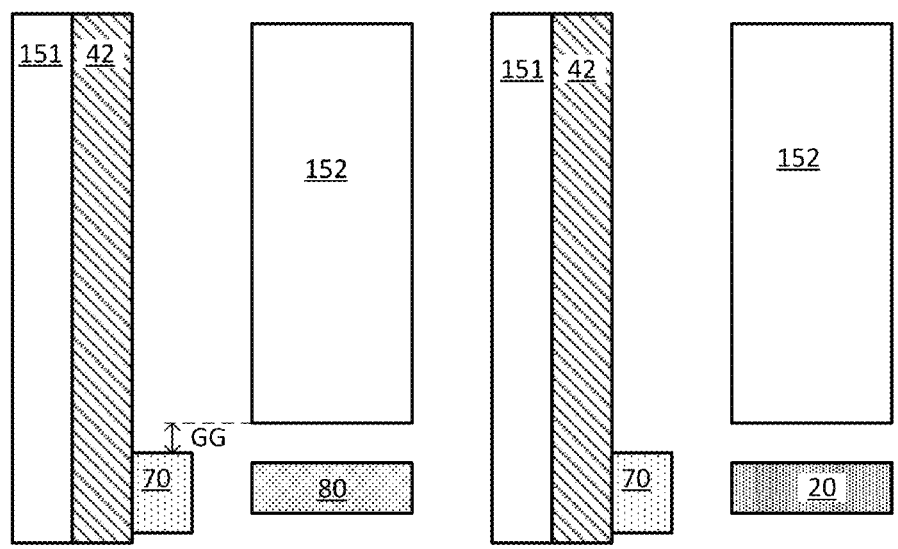
*Fig. 12B*     *Fig. 12C*

ELECTRO-MECHANICAL SWITCHING DEVICES

TECHNICAL FIELD

The present invention relates generally to electronic devices, and, in particular embodiments, to electro-mechanical switching devices and methods of forming thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

Power semiconductor devices are commonly used in many applications. A common metric for the comparison of power devices is the relation between specific on-resistance and breakdown voltage. Conventional semiconductor power devices have a tradeoff for a given type of device substrate. In other words, a device with low on-resistance along with high breakdown voltage is not achievable beyond this tradeoff.

Nano-electro-mechanical (NEM) relay technology has been suggested for ultra-low-power complementary logic applications.

SUMMARY

In accordance with an embodiment of the present invention, a switching device includes an opening disposed in a substrate. A source is disposed adjacent the opening and having a contact surface parallel to sidewalls of the opening. A drain is disposed adjacent the opening and has a contact surface parallel to the sidewalls of the opening. A moveable gate stack includes a channel and a gate. The moveable gate stack is disposed within the opening.

In accordance with another embodiment of the present invention, a switching device includes an opening disposed in a substrate including a first sidewall and an opposite second sidewall, a source disposed in and/or over the opening, a drain disposed in and/or over the opening, and a channel disposed in the opening. The channel includes a moveable conductive element having a first position and a second position. In the first position, the moveable conductive element is configured to contact the drain and the source. In the second position, the moveable conductive element is configured to be separated from the drain region and the source by an air gap.

In accordance with yet another embodiment of the present invention, an integrated circuit includes a plurality of switching devices. Each switching device of the plurality of switching devices includes an opening disposed in a substrate, a source region, a drain region, a gate line oriented along a first direction including a moveable conductive element disposed within the opening. The moveable conductive element is configured to contact the source region and the drain region in a first state of the switching device and configured to be isolated from the source region and the drain region in a second state of the switching device. The plurality of switching devices is arranged in rows along the first direction and columns along a second direction perpendicular to the first direction. A first gate line of one of the plurality of switching devices is coupled to an adjacent second gate line of another of the plurality of switching devices in the same row by a conductive line in a metal level above the first gate line.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A-6E illustrates a vertical electro-mechanical switch in accordance with an embodiment of the present invention, wherein FIGS. 6A and 6D-6E are alternative cross-sectional views, while FIG. 6B is a top sectional view and FIG. 6C is a side sectional view;

FIGS. 7A-7C illustrates a vertical electro-mechanical switch in accordance with an embodiment of the present invention, wherein FIG. 7A is a cross-sectional view, while FIG. 7B is a top sectional view and FIG. 7C is a side sectional view;

FIG. 9A illustrates a top view of the switching device illustrated in FIG. 8A in one embodiment of the present invention, wherein

FIG. 10A illustrates a top view of the switching device illustrated in FIG. 8A in one embodiment of the present invention, wherein

FIG. 11A illustrates a top view of the switching device illustrated in FIG. 8A in one embodiment of the present invention, wherein

FIG. 12A illustrates a vertical electro-mechanical switch comprising a mesa within the opening in accordance with an embodiment of the present invention, wherein FIG. 12A illustrates a cross-sectional view while FIG. 12B and FIG. 12C illustrate top sectional view of the vertical electro-mechanical switch of FIG. 12A;

FIG. 13A illustrates a vertical electro-mechanical switch comprising a mesa within the opening in accordance with an embodiment of the present invention, wherein FIG. 13A illustrates a cross-sectional view while

FIGS. 14A-14D illustrate a vertical electro-mechanical switch comprising a mesa within the opening in accordance with an embodiment of the present invention, wherein FIG. 14A illustrates a cross-sectional view while FIGS. 14B-14D illustrate top sectional views of the vertical electro-mechanical switch of FIG. 14A;

FIGS. 15A-15B illustrate a vertical electro-mechanical switch comprising a mesa within the opening in accordance with an embodiment of the present invention, wherein FIG. 15A illustrates a cross-sectional view while FIG. 15B illustrates a top sectional view of the vertical electro-mechanical switch of FIG. 15A;

DETAILED DESCRIPTION OF ILLUSTRATIVE EMBODIMENTS

Embodiments of the present invention describe a vertical electro-mechanical switch that can be also used as power devices as well as in applications requiring high density transistor integration such as logic, volatile memory, and others. The vertical structure of the electro-mechanical switch introduces many advantages over traditional solutions. As will be described further in various embodiments, in the vertical electro-mechanical switch, current flow from a source node to a drain node is in a vertical direction through a moveable channel.

Figure 1:
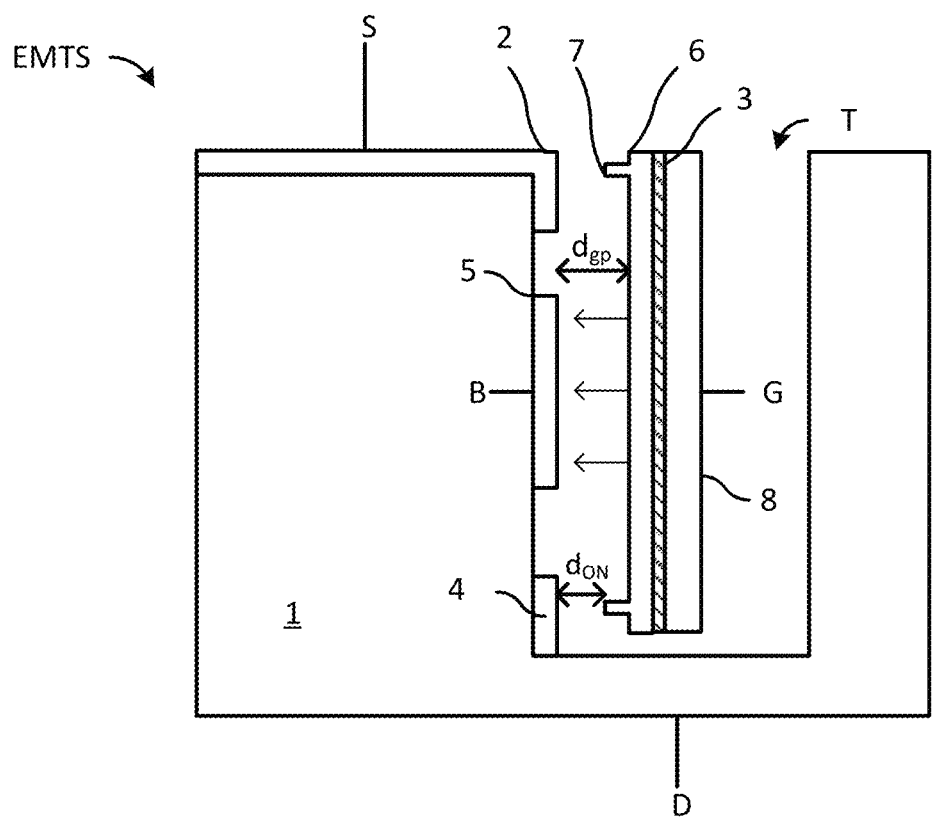
FIG. 1 illustrates a cross-sectional view of a vertical electro-mechanical switch in accordance with an embodiment of the present invention.

FIG. 1 illustrates a cross-sectional view of a vertical electro-mechanical switch in accordance with an embodiment of the present invention.

FIG. 1 illustrates a four terminal switch comprising a source contact (S), a drain contact (D), a body contact (B), and a gate contact (G).

In various embodiments, the switch is an electro-mechanical vertical channel switch (EMVCS). Accordingly, the components of the electro-mechanical vertical channel switch are disposed within an opening T in a substrate 1. The opening T may be a trench or a cylindrical opening.

The EMVCS comprises a source layer 2 and a drain layer 4 separated by a body layer 5. The gate layer 8 is isolated by the gate dielectric layer 3 from a channel layer 6.

The source layer 2, the drain layer 4, and the body layer 5 are disposed along the sidewalls of the opening T in the substrate 1 in various embodiments. In various embodiments, the gate layer 8, the gate dielectric layer 3, and a channel layer 6 are disposed within the opening and are moveable components. In one or more embodiments, they are designed to move towards the body layer 5 when a suitable electrostatic potential is applied on the body layer 5 and the gate layer 8. The relative locations of the source layer 2 and the drain layer 4 may be exchanged in alternative embodiments.

A channel layer 6 is formed on the other side of the gate dielectric layer 3 and is isolated from the gate layer 8 by the gate dielectric layer 3. Accordingly, the channel layer 6 is not contacted to a terminal node and remains floating. The channel layer 6 may include protrusions 7 (tips) in some embodiments to establish electrical contact while minimizing sticking related issues. For example, the channel layer 6 may include perforations or discontinuities into the plane of the paper.

The substrate 1 may be an insulating substrate in one embodiment. Alternatively, the substrate 1 comprises a dielectric liner under the source layer 2 and the body layer 5 so as to electrically insulate the drain layer 4 from the body layer 5 and the source layer 2. Alternatively, a portion of the opening T may be disposed within an insulating layer disposed over the substrate 1 thereby electrically insulating the drain layer 4 from the body layer 5 and the source layer 2.

Figure 3A:
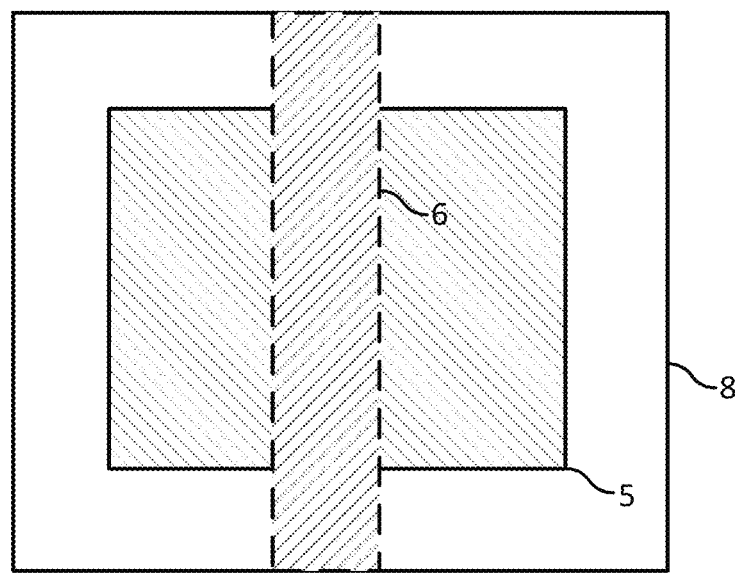
FIGS. 3A-3C illustrate a side cross-sectional view of the moveable channel layer attached to the gate stack in accordance with embodiments of the present invention.
Figure 3B:
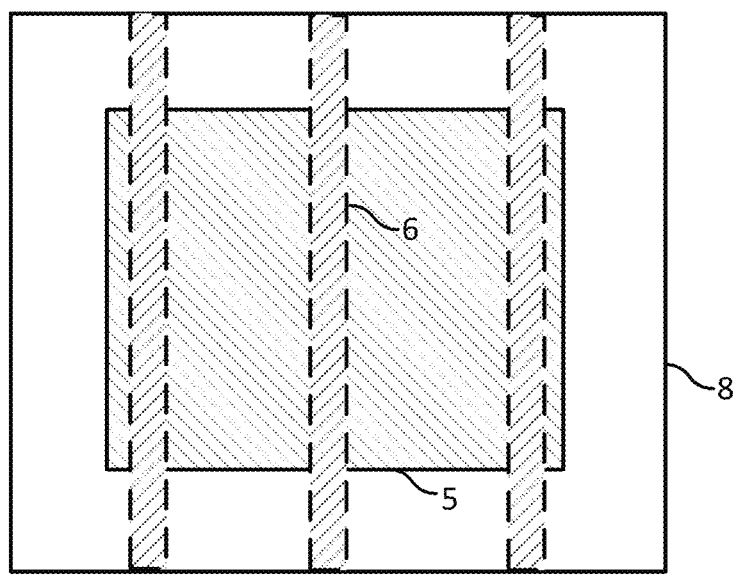
Figure 3C:
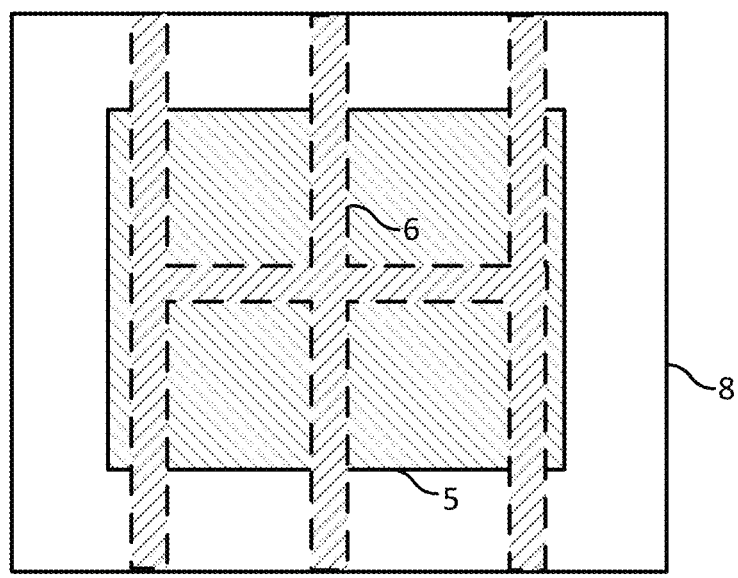

In some embodiments, the channel layer 6 may be designed so as to avoid shielding the gate layer 8 from a potential at the body layer 5. Some embodiments of the channel layer 6 are illustrated in FIGS. 3A-3C. As is evident, for an electrostatic actuation to occur, the channel layer 6 must be interrupted in a third dimension (into the paper plane of FIG. 1 as shown in FIGS. 3A-3C). One plane (closed channel) serves for conduction between the source layer 2 and drain layer 4, while another plane (open channel) serves for electrostatic attraction between gate layer B and the body layer 5.

Introducing a fourth terminal to bias the body structure of the device allows for a dynamic change of the pull in/threshold voltage of the gate during device operation.

The source layer 2, the drain layer 4, the body layer 5, the gate layer 8, and the channel layer 6 are conductive and are formed from a metallic material or a semiconductor material having a low resistance. In various embodiments, the source layer 2, the drain layer 4, the body layer 5, and the channel layer 6 comprise titanium, tungsten, titanium nitride, tungsten nitride, tantalum, tantalum nitride, and conductive carbides thereof.

In various embodiments, the gate layer 8 comprises an elastic material to provide elastic movement. In some embodiments, the gate layer 8 also comprises the same material as the channel layer 6. However, in many embodiments, the gate layer 8 comprises silicon or polysilicon and may be attached to the substrate 1 along the sides of the opening T.

The EMVCS is illustrated as a vertical device having a source contact (S) at the top major surface and a drain contact (D) at the bottom major surface of the substrate 1. However, the EMVCS may also be implemented such that the drain contact (D) and the source contact (S) are both made from the top major surface.

The operation of the EMVCS will now be described. The EMVCS is normally in an OFF position because the source layer 2 and the drain layer 4 are isolated from each other. For example, in the OFF state, the gate layer 8 and the body layer 5 are both at the same potential, e.g., at ground potential. The source layer 2 and the drain layer 4 may be biased to different voltages in the OFF stage but nevertheless no current flows through the EMVCS.

If the EMVCS is to be switched to an ON state, a potential difference is established between the gate layer 8 and the body layer 5. For example, this may be accomplished by biasing the gate layer 8 relative to the body layer 5. Accordingly, when the gate contact (G) is biased to an opposite potential relative to the body contact (B), the potential difference across the air gap pulls the gate layer 8 towards the body layer 5 (direction of the movement of the gate layer 8 due to the pull is shown by the arrows in FIG. 1). The electrostatic force pulls and moves the suspended gate layer 8 towards the body layer 5. When the channel layer 6 physically contacts the source layer 2 and the drain layer 4, the EMVCS transitions to an ON state and an ON current flows through the switch. Additionally, the ON state current does not flow through the body layer 5 because the body layer 5 is separated from the channel layer 6. Therefore, advantageously, actuation of the device requires capacitive current flow only with no ohmic losses.

When the attractive electrostatic force between the gate layer 8 and the body layer 5 is removed, the EMVCS turns OFF. In particular, elastic anchors holding the moveable gate stack eventually pull back the channel layer 6 from the source layer 2 and the drain layer 4 thereby disconnecting the electrical connection between the source layer 2 and the drain layer 4.

Design parameters that impact the spring constant, pull in voltage, breakdown voltage include the depth/height of the opening, the thickness of the gate layer 8, the thickness of the gate dielectric layer 3, materials of the source layer 2, the drain layer 4, and the channel layer 6 (and protrusions 7 if present), the area of the overlap between the body layer 5 and the gate layer 8, an ON gap $d_{ON}$ between the protrusions 7 and the source layer 2 (or the drain layer 4), and the actuation gap $d_{gp}$ between the body layer 5 and the gate layer 8.

Advantageously, the channel resistance during the ON state may be negligible if the channel layer 6 is made of a conductive material such as a metallic material. In contrast, channels of conventional transistors are made of semiconductive material, which offer resistance to current flow even under ON state due to various short channel effects such as mobility degradation.

In embodiments of the present invention, the ON state resistance ($R_{ON}$) is primarily due to the contact resistance between the various materials in the current path. Similarly, the OFF state resistance is primarily due to the gap resistance of the air gap within the opening. The break-down voltage of the air gap can be significantly much larger than even intrinsic semiconductor regions. Therefore, the EMVCS offers much better ON/OFF characteristics (on resistance to break down voltage tradeoff) than conventional field effect transistors. Additionally, the vertical nature of the current flow and the vertical moveable members enable higher levels of integration than planar mechanical devices. Thus, a higher current density as well as a higher transistor density may be obtained with a shorter foot print compared to conventional field effect transistors.

In various embodiments, the EMVCS may be used as a discrete device or may be part of a plurality of devices of an integrated circuit. Alternatively, the vertical switch may be a discrete component (i.e., a single transistor) formed by a plurality of such devices formed within the substrate 1 and coupled in parallel.

FIGS. 2A-2F illustrate a moveable gate layer in accordance with an embodiment of the present invention.

The embodiments illustrated in FIGS. 2A-2F have a slightly different location of the source layer 2, the drain layer 4, and the body layer 5. In this illustrated embodiment, the source layer 2, the drain layer 4, and the body layer 5 are located side by side whereas in the prior embodiment of FIG. 1, they were stacked on top of each other. However, the explanations described below for various embodiments of the moveable gate stack apply equally to both the embodiments of FIG. 1 as well as FIGS. 2A-2F.

Figure 2A:
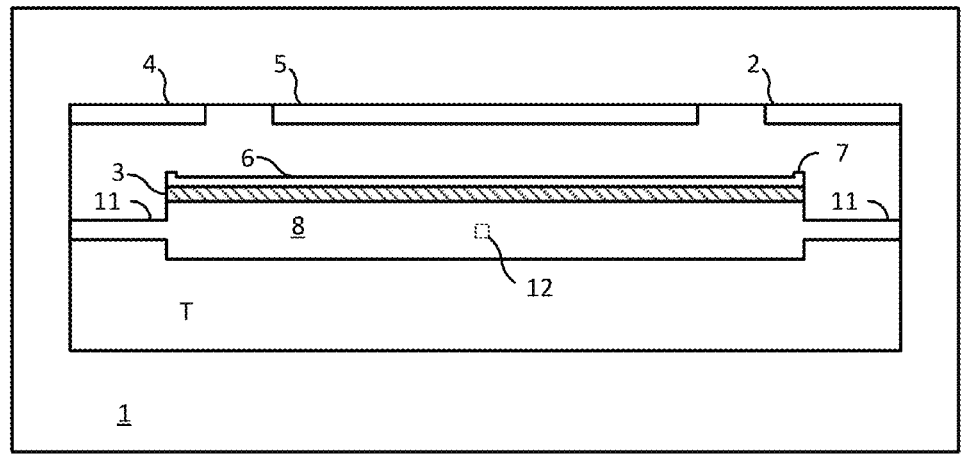
FIGS. 2A-2F illustrate a moveable gate layer in accordance with an embodiment of the present invention.

FIG. 2A illustrates a top view of the electro-mechanical vertical channel switch EMVCS illustrating the elastic anchoring of the gate stack in accordance with an embodiment of the present invention.

In one embodiment, the moveable gate stack comprising the gate layer 8, the gate dielectric layer 3, and the channel layer 6 are suspended along the sides of the opening sidewall. In one embodiment, the gate layer 8 may be narrowed to a thin section such as the thin sections 11 so as to allow the gate stack freedom to move. In one embodiment, the thin sections 11 may also be attached to the opening bottom surface. In one or more embodiments, the gate layer 8 may supported from a bottom anchor 12, which may be either a rigid anchor or an elastic anchor.

Figure 2B:
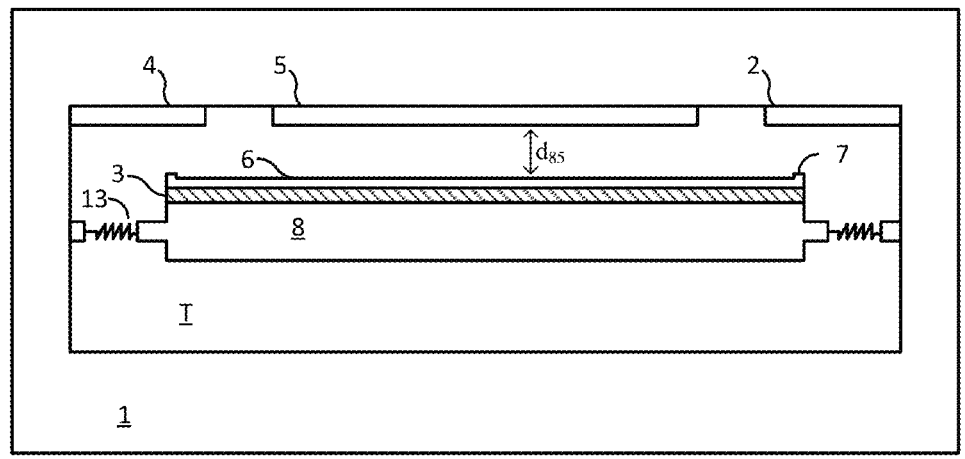
Figure 2C:
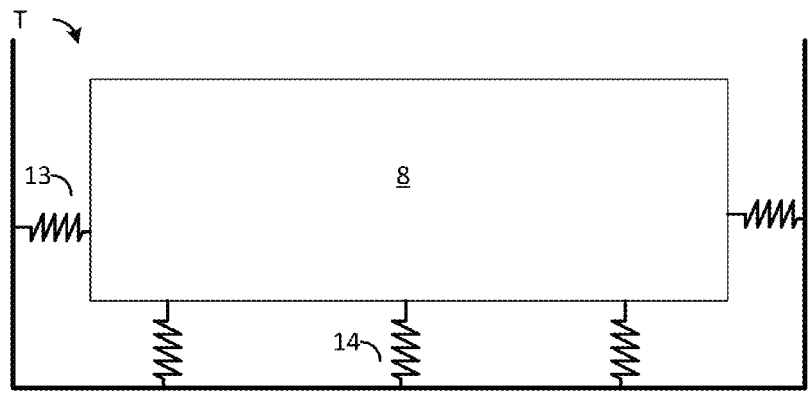

FIGS. 2B and 2C illustrate a moveable gate stack attached to the opening sidewalls in accordance with an embodiment of the present invention. FIG. 2B is a top view while FIG. 2C is a schematic cross-sectional view illustrating only the springs.

Referring to FIGS. 2B and 2C, in one embodiment, lateral springs 13 are used to mechanically couple the gate layer 8 with the opening sidewalls while vertical springs 14 are used to mechanically couple the gate layer 8 with the bottom surface of the substrate 1. The spring constant and direction of expansion of the springs may be designed such that the gate layer 8 is allowed to move only in a single direction. For example, the gate layer 8 may be allowed to move only along the direction $d_{85}$, i.e., towards (or away) from the body layer 5. In further embodiments, the gate layer 8 may be attached using only the lateral springs 13 or using one or more of only the vertical springs 14.

The lateral springs 13 and/or the vertical springs 14 also ensure that the gate stack including the channel layer is pulled back from the body layer 5 when the electrostatic force between the body layer 5 and the gate layer 8 is turned OFF. This characteristic is very critical for the proper functioning of the EMVCS as otherwise the EMVCS will continue to conduct current even in the OFF state when the device is turned OFF. In this respect, the lateral springs 13 and/or the vertical springs 14 force the gate stack back into the reference OFF position.

The lateral springs 13 and/or the vertical springs 14 may be made of the same material as the gate layer 8, for example, silicon or poly silicon.

In various embodiments, the lateral springs 13 and/or the vertical springs 14 provide moveable functionality to the gate stack by allowing the gate stack to move when subjected to the electrostatic force during the ON state and then pulling back the gate stack when the electrostatic force is reduced or removed.

Figure 2D:
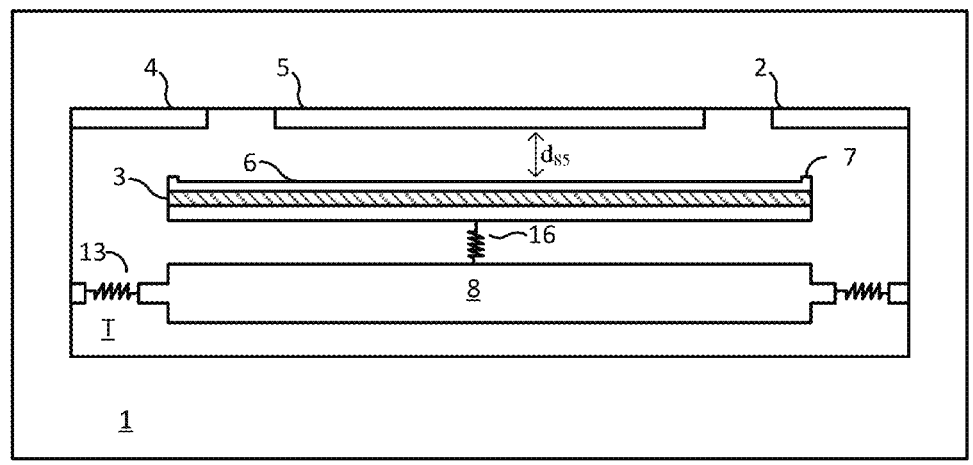

FIG. 2D illustrates a top view of the electro-mechanical vertical channel switch EMVCS illustrating a moveable gate stack comprising an internal elastic component in accordance with an embodiment of the present invention.

In alternative embodiments, the gate stack itself may be formed as a spring so that an elastic spring is included in the structure of the gate stack. In one embodiment, as illustrated in FIG. 2D, the elastic spring is part of the gate layer 8.

Figure 2E:
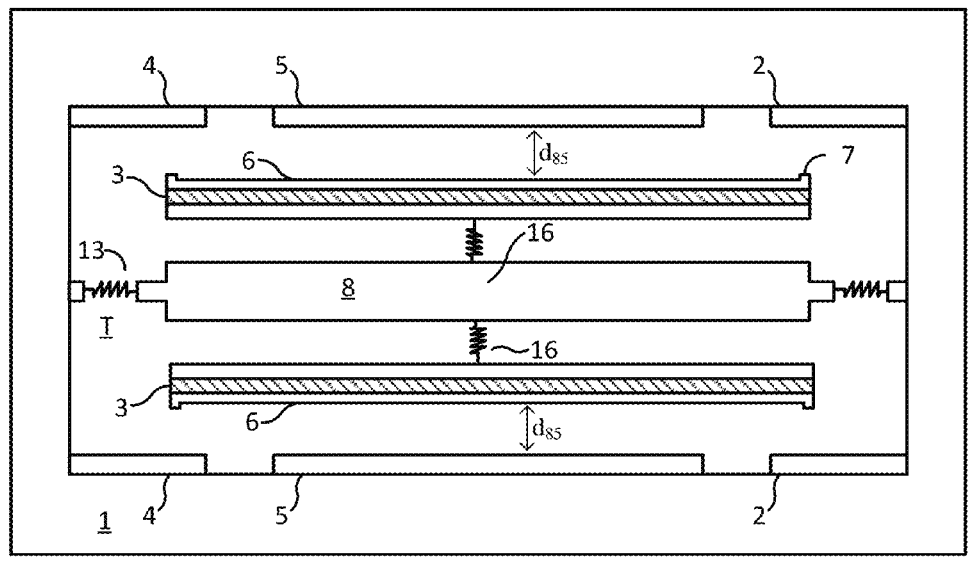

FIG. 2E illustrates a top view of the electro-mechanical vertical channel switch EMVCS illustrating a moveable gate stack comprising an internal elastic component so as to allow motion of the gate layer in two independent modes in accordance with an embodiment of the present invention.

Thus, as illustrated in FIG. 2E, the gate layer 8 may enable double sided motion, which can be utilized to form two conductive current paths as in FIG. 2E. Each conductive path is independent of the other path and depends only on the motion of the channel layer 6 facing the top sidewall or bottom sidewall of the opening. Accordingly, leveraging the dual conductive paths, a high density switching device may be formed.

Figure 2F:
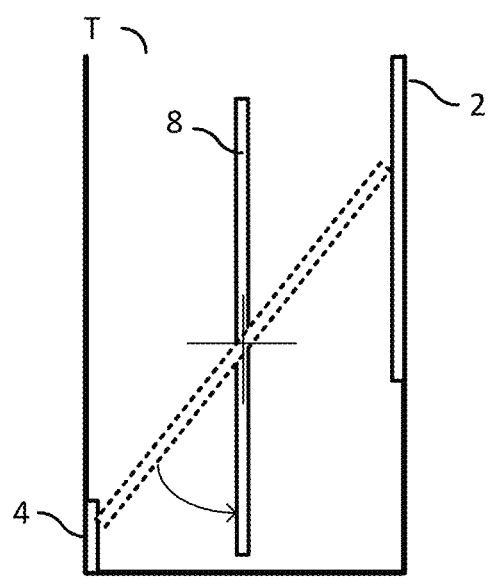

FIG. 2F illustrates a cross-sectional schematic of a vertical electro-mechanical device including rotational movement in accordance with an embodiment of the present invention.

In further embodiments, the source and the drain may be located on opposite sides of the opening. The area of the source layer 2 may be increased relative to the drain layer 4 so as to increase the electrostatic pull towards the source layer 2. Additionally, the bias of the gate layer 8 may be adjusted relative to the bias of the source layer 2 and the drain layer 4 so as to increase the electrostatic pull towards the source layer 2 while minimizing the repulsion towards the drain layer 4.

FIGS. 3A-3C illustrate a side cross-sectional view of the moveable channel layer attached to the gate stack in accordance with embodiments of the present invention.

FIG. 3A illustrates a channel layer 6 overlapping with the body layer 5 and the gate layer 8. However, the foot print of the channel layer 6 is kept small to prevent shielding of the electric field lines between gate layer 8 and the body layer 5. However, the channel layer 6 includes a thickness sufficient to avoid significant channel resistance.

FIGS. 3B and 3C illustrate alternative embodiments of the moveable channel layer. In FIG. 3B, strips of the channel layer 6 is formed on the gate stack. In FIG. 3C, the channel layer 6 is formed as a grid.

Figure 4:
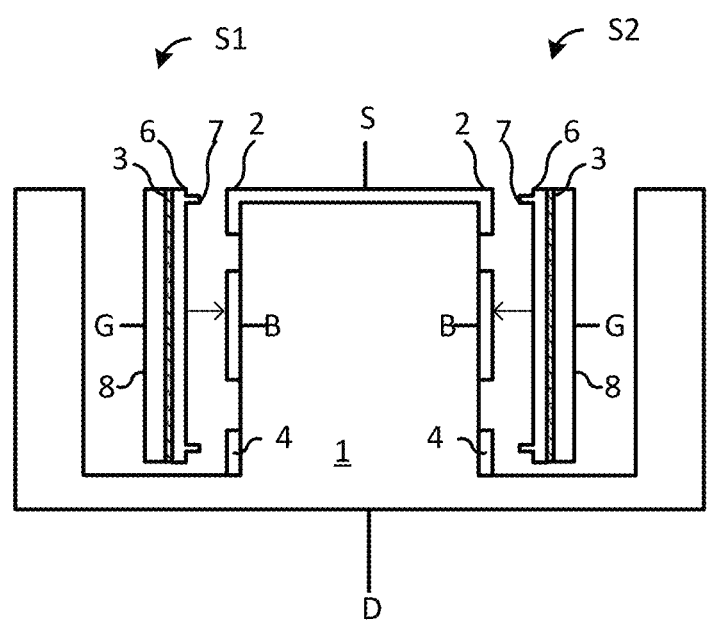
FIG. 4 illustrates an alternative embodiment showing two EMVCS devices integrated together to form a single device.

FIG. 4 illustrates an alternative embodiment showing two EMVCS devices integrated together to form a single device.

Referring to FIG. 4, the EMVCS device includes a first switch S1 and a second switch S2. As in the prior embodiment, each of them has a separate opening within which the moveable gate stack is disposed. However, the source node S and the drain node D may be shared so that the two switches are electrically coupled in parallel. Using this embodiment, a higher current density per unit area is obtained due to the sharing of common source/drain areas.

Figure 5A:
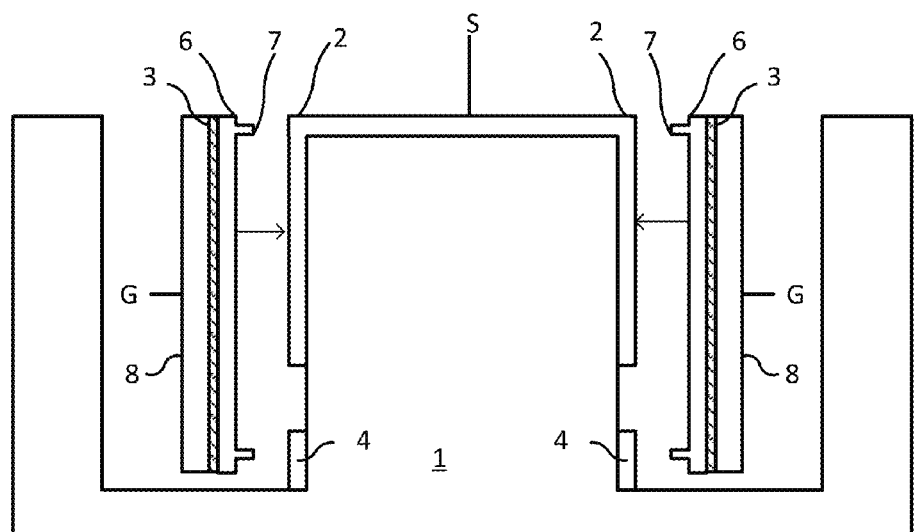
FIG. 5A illustrates a cross-sectional view of an electro-mechanical vertical channel switch (EMVCS) device having only three terminal nodes in accordance with an embodiment of the present invention.

FIG. 5A illustrates a cross-sectional view of an electro-mechanical vertical channel switch (EMVCS) device having only three terminal nodes in accordance with an embodiment of the present invention.

Embodiments of the present invention may also be applied to form three terminal electro-mechanical switches.

In one embodiment, as illustrated in FIG. 5A, the EMVCS device includes a source layer 2 and a drain layer 4 at the bottom that is connected to a drain node D at the bottom surface of the device. In such embodiments, the electrostatic force between the source contact S and the gate contact G is used to establish the electrostatic pull of the gate stack. For example, in one illustration, in the OFF state the source contact (S) is at a ground potential (Vss), the drain contact (D) is at operating voltage (e.g. VDD), and the gate contact (G) is at ground potential. Therefore, there is no electrostatic force between the gate layer 8 and the source layer 2. When the EMVCS is to be switched to an ON state, the gate contact (G) is flipped to a positive potential causing the gate stack to be pulled towards the source layer 2. Alternatively, the EMVCS may be switched to an ON state, when the gate contact (G) is flipped to a negative potential so that the gate to source voltage exceeds the pull in voltage of the device. As in prior embodiments, when the channel layer physically contacts the source layer 2 and the drain layer 4, the EMVCS transitions to an ON state and starts conducting an ON state current. Advantageously, in this embodiment as well, only capacitive current is needed to switch the device and minimizes ohmic losses.

When the gate contact (G) is switched back again, below a certain voltage, the electrostatic force pulling the gate stack towards the source layer 2 is reduced and the elasticity of the spring holding the gate stack pulls it back to the reference position.

Figure 5B:
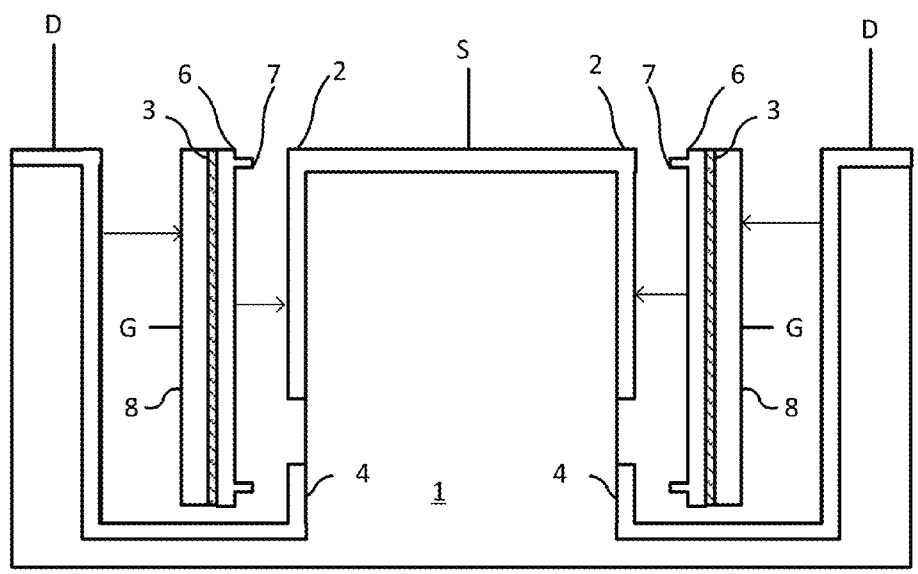
FIG. 5B illustrates a cross-sectional view of a three terminal EMVCS device having all contact nodes on one side of the substrate in accordance with an embodiment of the present invention.

FIG. 5B illustrates a cross-sectional view of a three terminal EMVCS device having all contact nodes on one side of the substrate in accordance with an embodiment of the present invention.

In one or more embodiments, all contacts to the EMVCS device may be made from the same surface. In one illustration, a continuous layer forms either the source or the drain and lines the bottom surface of the opening T and the top surface of the substrate 1. In FIG. 5B, the drain layer 4 lines the bottom surface of the opening and the top surface of the substrate 1.

In further embodiments, the EMVCS device may be a three terminal transistor. Accordingly, the attractive force between the gate layer 8 and the source layer 2 and/or a repulsive force between gate layer 8 and the drain layer 4 may help to turn ON the device. The repulsive force between gate layer 8 and the drain layer 4 may further help to stabilize the gate stack when the device is switched OFF. For example, the gate stack may be damped due to the repulsive force between gate layer 8 and the drain layer 4 because in the OFF state the gate layer 8 is biased down (e.g., Vss) while the drain layer 4 may continue to be biased at the operating voltage (e.g., VDD).

Figure 5C:
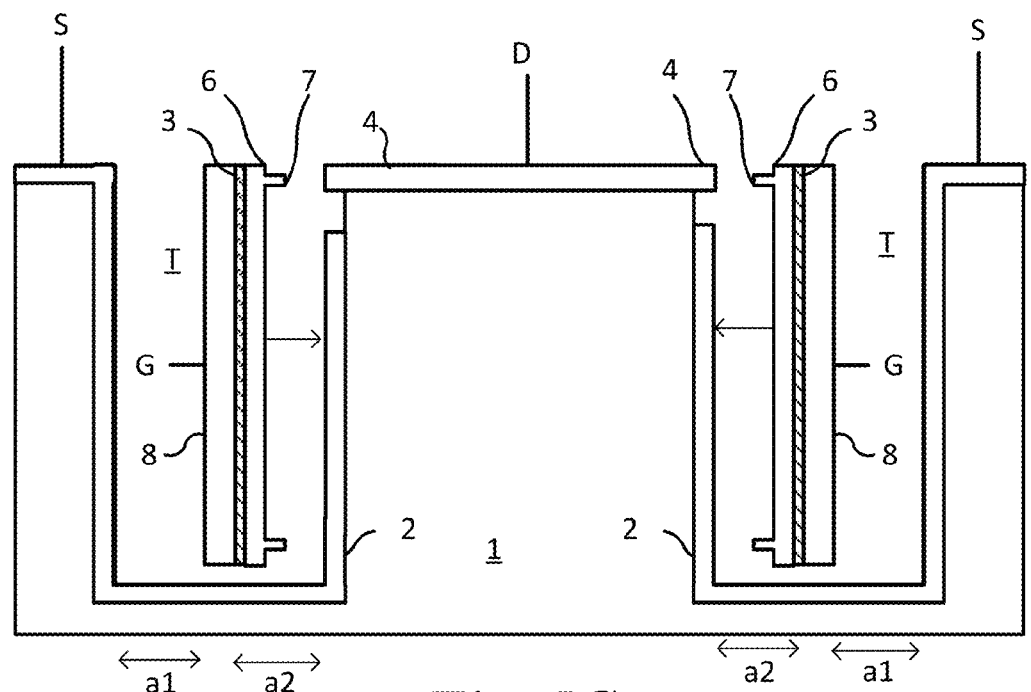
FIG. 5C illustrates a cross-sectional view of a three terminal EMVCS device having all contact nodes on one side of the substrate in accordance with an alternative embodiment of the present invention.

FIG. 5C illustrates a cross-sectional view of a three terminal EMVCS device having all contact nodes on one side of the substrate in accordance with an alternative embodiment of the present invention.

In this embodiment, unlike the prior embodiment, the source layer 2 is disposed on the bottom surface of the opening T. The gate stack is asymmetrically placed so that the electrostatic pull towards the sidewall of the trench including the drain layer 4 is much more than the electrostatic pull towards the sidewall of the trench without the drain layer 4. The electrostatic force of a capacitor depends not only on the distance between the plates but also on the dielectric constants of the materials between the plates. In some embodiments, the first distance a1 is greater than the second distance a2. FIG. 5C is a schematic representation and is not necessarily to scale. In an additional embodiment, the drain layer 4 is commonly shared between adjacent devices.

Figure 6A:
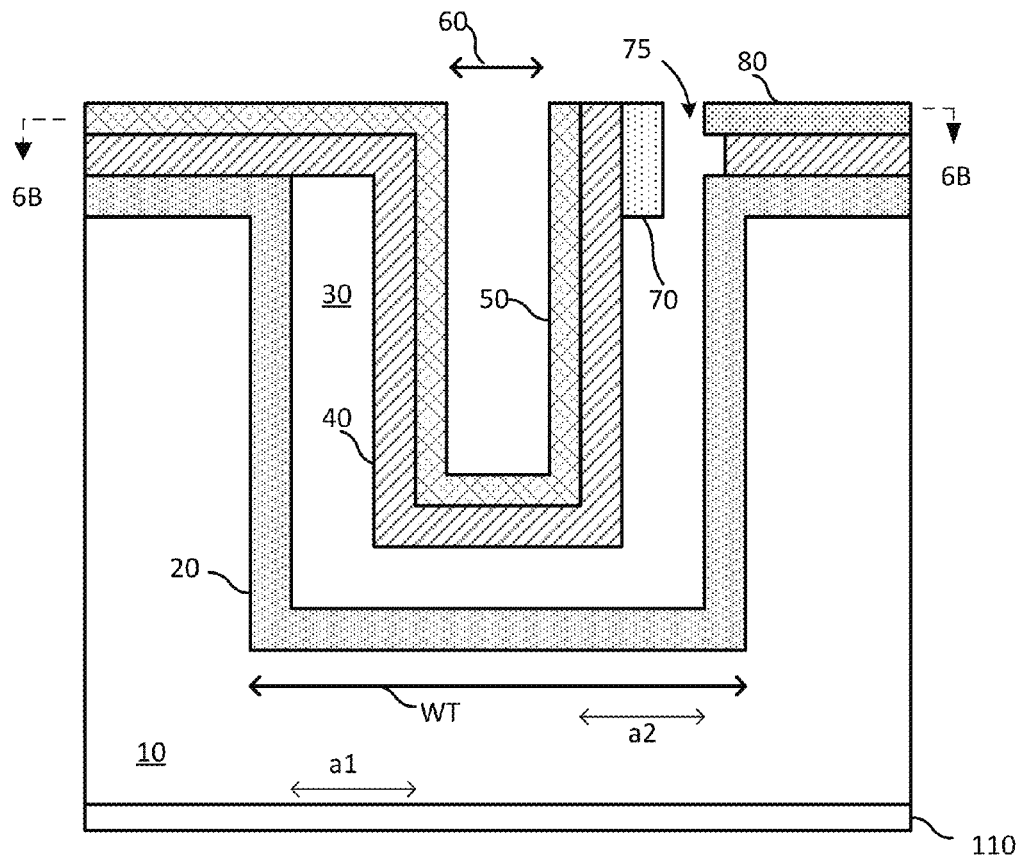
Figure 6B:
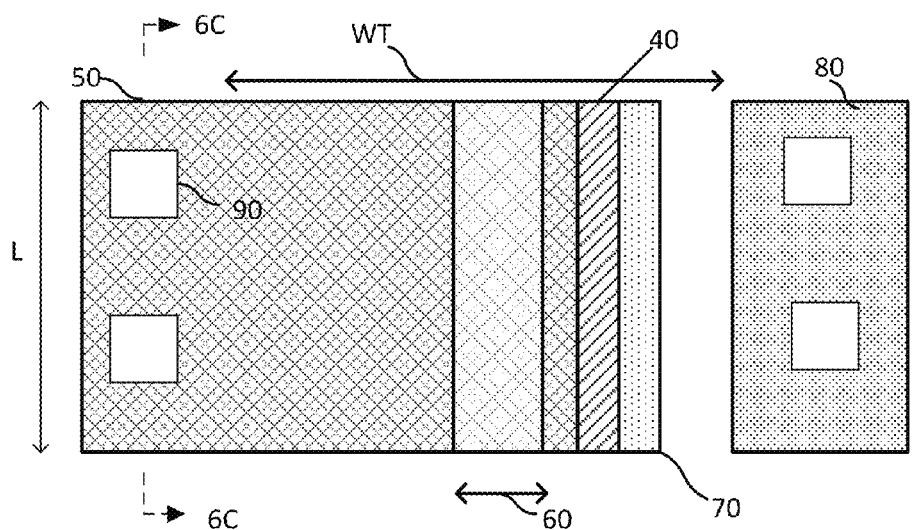
Figure 6C:
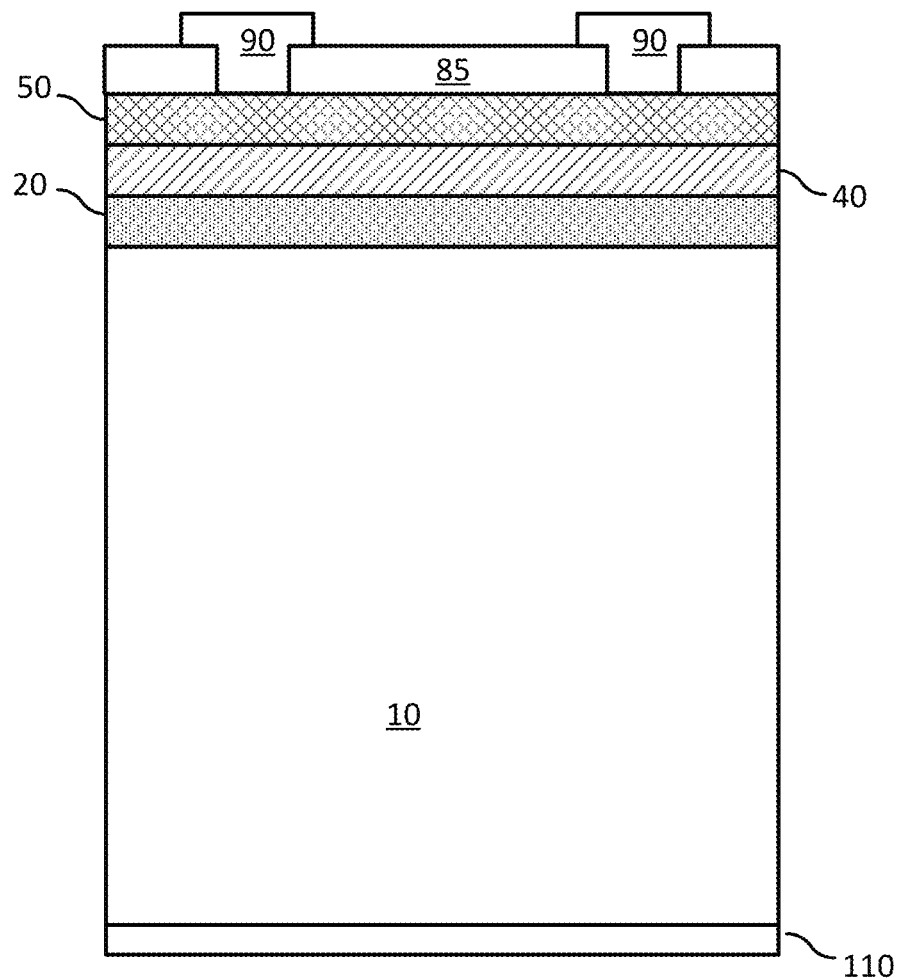
Figure 6D:
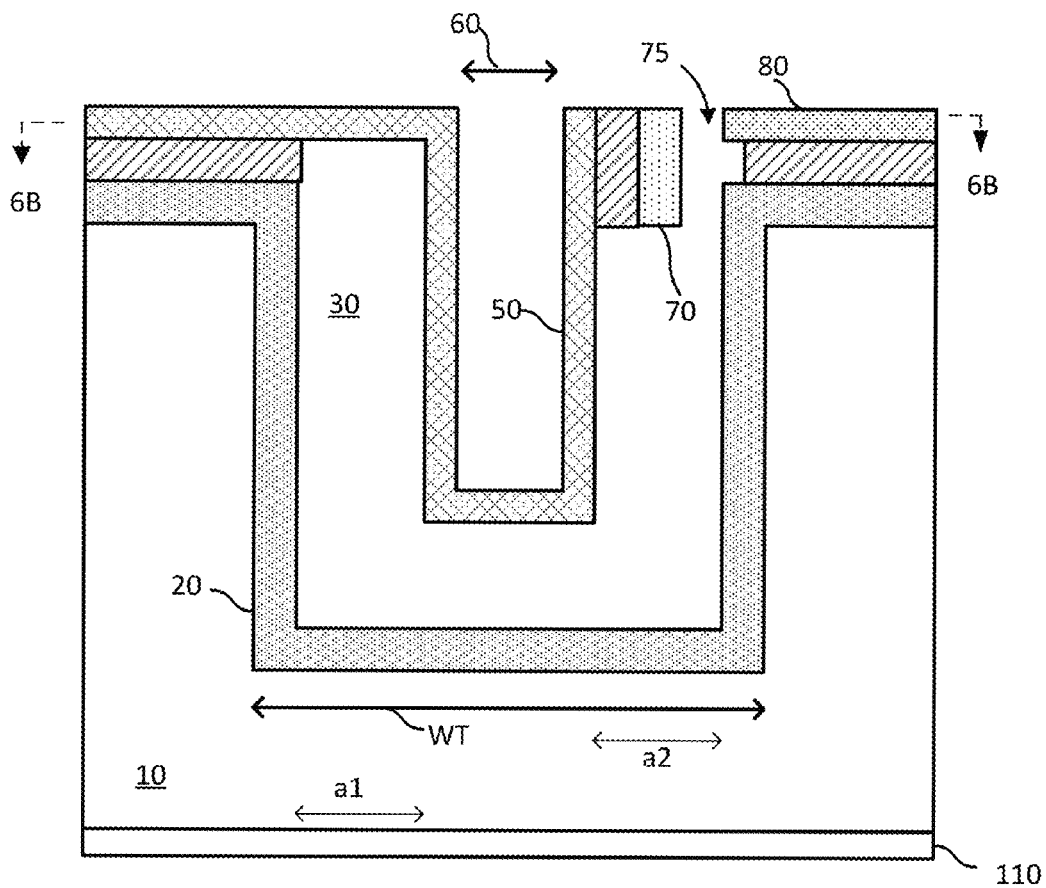
Figure 6E:
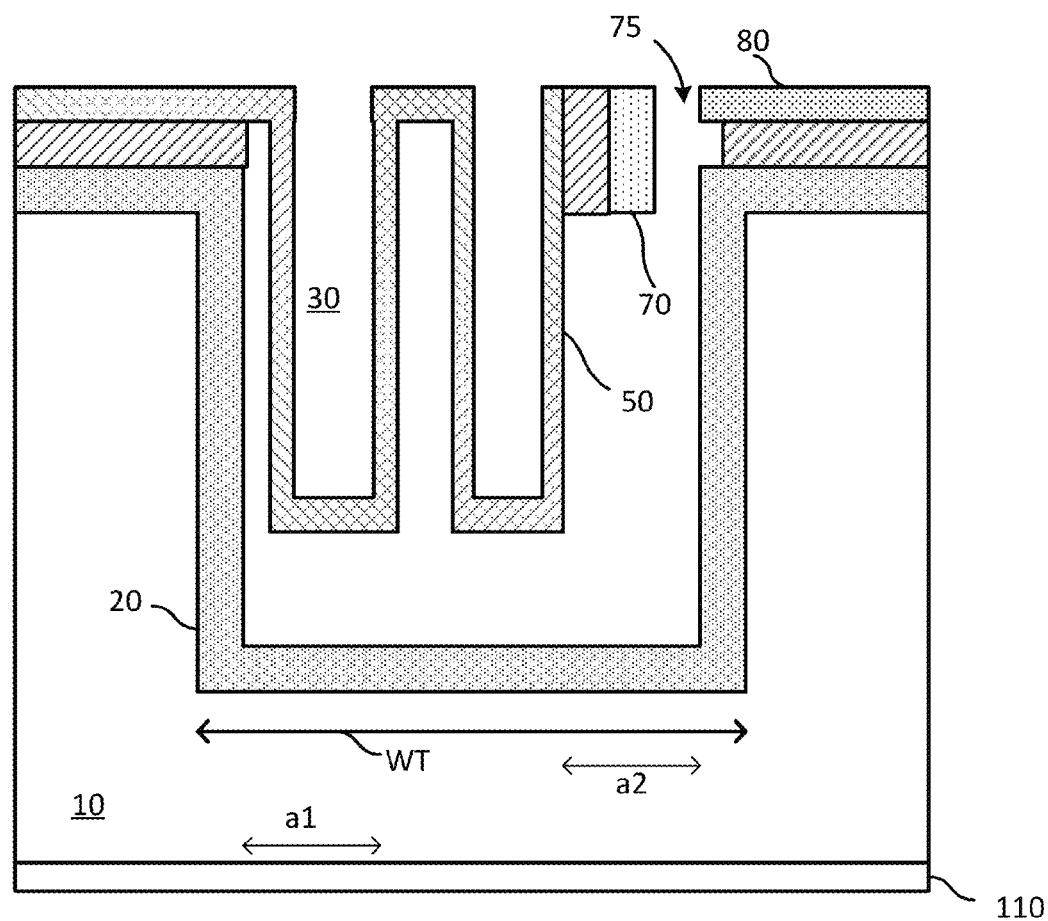

FIGS. 6A-6E illustrates a vertical electro-mechanical switch in accordance with an embodiment of the present invention. FIGS. 6A and 6D-6E are alternative cross-sectional views, while FIG. 6B is a top sectional view and FIG.

6C is a side sectional view. FIG. 6A is a cross-sectional view of an alternative embodiment.

Referring to FIG. 6A, the switch includes a substrate 10 having an opening, which may be a cylindrical opening or a trench in various embodiments. The opening has a width WT as illustrated. The sidewalls and bottom surface of the trench are covered by a first conductive layer 20. In one or more embodiments, the substrate 10 itself may act as this conductive layer 20, by the use of a doped layer formed by an implantation, plasma doping, or a solid state diffusion process.

The first conductive layer 20 is a metal layer in one or more embodiments. The first conductive layer 20 is coupled to a source contact pad, which is a node connected to source potential, in one embodiment and therefore acts as the source of the switching device.

A first dielectric layer 40 is disposed over the first conductive layer 20. The first dielectric layer 40 physically contacts the first conductive layer 20 over the top surface of the substrate 10. The first dielectric layer 40 is also disposed within the opening but is separated from the sidewalls of the first conductive layer 20 by an air gap 30.

A control layer 50 is disposed over the first dielectric layer 40. The control layer 50 may be a poly silicon layer, poly silicon germanium in one embodiment. In another embodiment, the control layer 50 comprises an elastic metallic layer.

In one or more embodiments, the first dielectric layer 40 is a gate dielectric and may be a very thin layer. If the first dielectric layer 40 is less elastic than the control layer 50, the first dielectric layer 40 may crack at the corners so as to allow the switching device to operate unimpeded. For example, an initial factory setup may be used to form these cracks.

In an alternative embodiment, as illustrated in FIG. 6D, the first dielectric layer 40 is removed at least partially from under the control layer 50. This permits the control layer 50 more flexibility in responding to the electrostatic force.

A second conductive layer 70 is disposed along a sidewall of the first dielectric layer 40 and faces a third conductive layer 80 disposed over the substrate 10. The second conductive layer 70 is separated from the first conductive layer 20 and the third conductive layer 80 by a source/drain-channel gap 75.

The second conductive layer 70 is configured to form a vertical conductive path for current conduction when the second conductive layer 70 contacts the first conductive layer 20 and the third conductive layer 80. Accordingly, the second conductive layer 70 is akin to a current channel and the third conductive layer 80 functions like a source or a drain of the switching device while the control layer 50 is equivalent to a gate of the switching device.

In various embodiments, the first distance a1 and the second distance a2 may be adjusted to ensure that the electrostatic pull of the second conductive layer 70 is more towards the third conductive layer 80 (drain).

In one embodiment, the switching device may be a complete vertical device in which the one of the source/drain contact is made at the bottom surface of the substrate 10 while the other of the source/drain contact is made at the top surface of the substrate 10.

A narrow gorge 60 may remain within the opening. This narrow gorge 60 may be filled with a dielectric material if needed in some embodiments.

In the embodiment illustrated in FIG. 6A, a back side metallization is used to contact the first conductive layer 20 while the contact to the third conductive layer 80 is made from the top surface. This embodiment introduces a resistance within the substrate 10 and may be useful if the potential at the drain has to be reduced within the substrate 10. However, this embodiment also results in significant heating of the substrate 10 but may be used as input/output power switching device.

In additional embodiments, the substrate 10 may be a metallic substrate. In such embodiments, the first conductive layer 20 is part of the substrate 10. Additionally, in such embodiments, advantageously, the backside metallization layer 110 may be skipped.

FIG. 6B illustrates an embodiment of a top view of the switching device.

The second conductive layer 70 may remain floating while the third conductive layer 80 is contacted through contacts 90. Similarly, the control layer 50 may also be contacted. Further, the second conductive layer 70 is shown to extend continuously along the length L of the device in FIG. 6B. However, in some embodiments, the second conductive layer 70 may extend only for a fraction of the length L of the device.

FIG. 6C illustrates a side sectional view of the top sectional view of the device shown in FIG. 6B.

As illustrated in FIG. 6C, the contacts 90 may be coupled to the control layer 50. An insulating layer 85 is disposed over the control layer 50 and the third conductive layer 80 and may be used to separate adjacent contacts 90. The insulating layer 85 may be an oxide material in one embodiment such as silicon oxide. In other embodiments, the insulating layer 85 comprises a silicon nitride, mold compound including resins and epoxy materials, and others.

FIG. 6E illustrates a cross-sectional view of an alternative embodiment showing multiple fingers within a single opening.

The first dielectric layer 40 and the control layer 50 may include one or more of a "U"-shaped segment to increase the elasticity of the moveable gate stack. FIG. 6A shows a single "U"-shaped segment for illustration. FIG. 6E illustrates an alternative embodiment having two "U"-shaped segments for illustration.

Figure 7A:
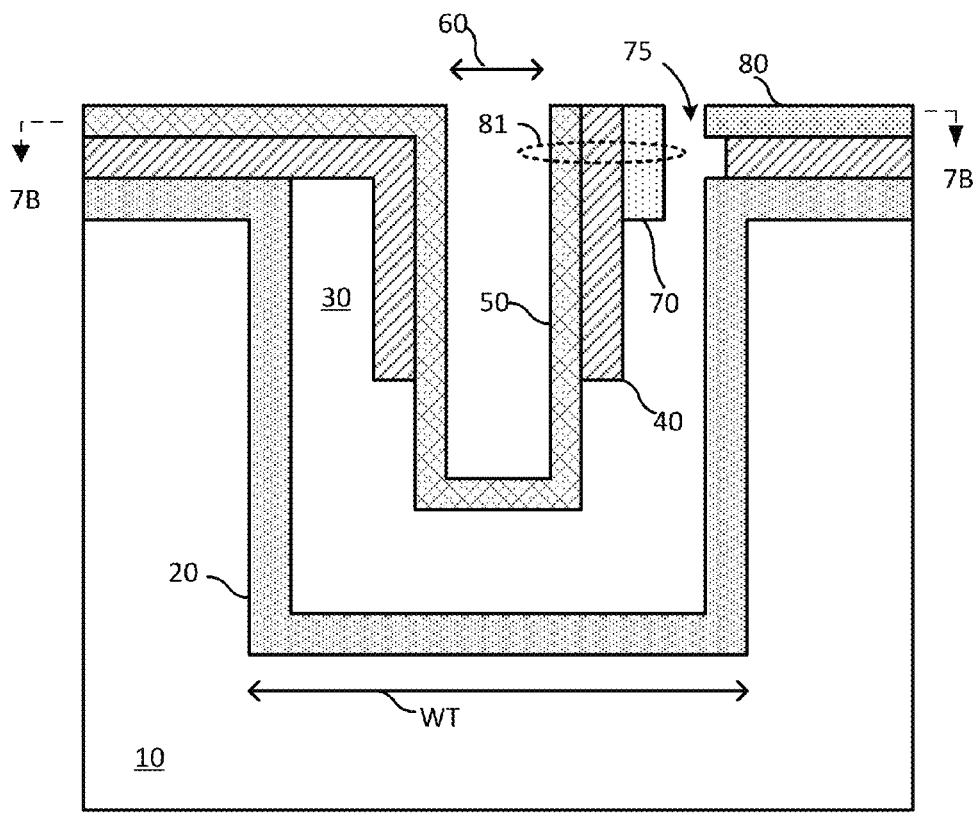
Figure 7B:
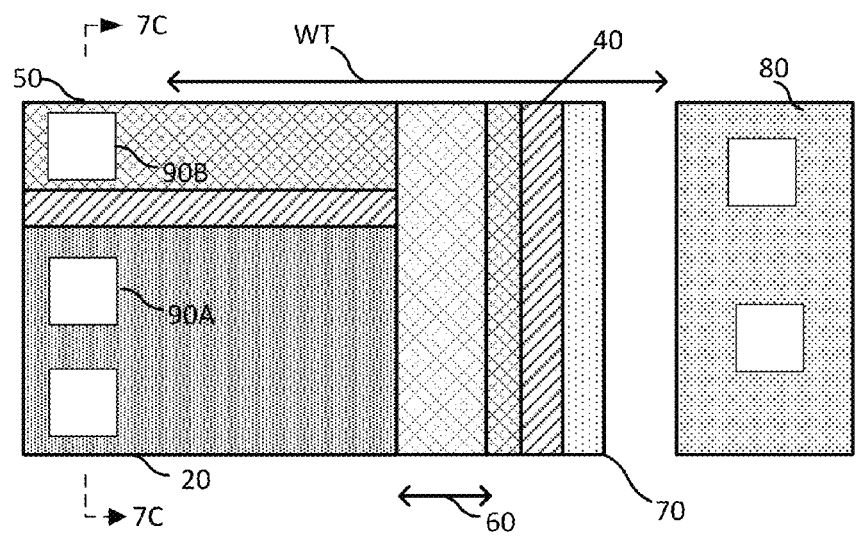
Figure 7C:
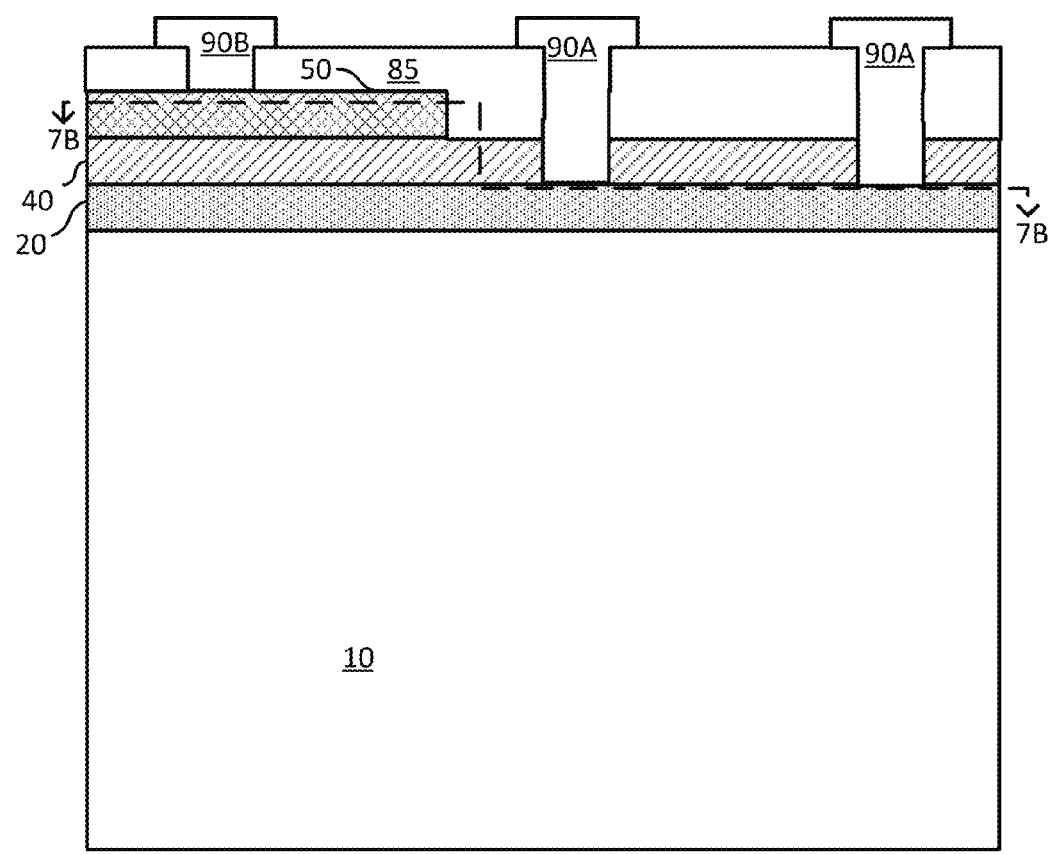

FIGS. 7A-7C illustrates a vertical electro-mechanical switch in accordance with an embodiment of the present invention. FIG. 7A is a cross-sectional view, while FIG. 7B is a top sectional view and FIG. 7C is a side sectional view.

Unlike the embodiment illustrated in FIGS. 6A-6D, in this embodiment, all the contacts are made from the top surface or the same side of the substrate 1. This avoids introducing any additional substrate resistance as in the prior embodiment of FIG. 6.

Referring to FIG. 7A, the back side of the substrate 10 includes no contacts for the first conductive layer 20. Instead, the first conductive layer 20 is contacted from the front side of the substrate 10, which is better visualized in FIGS. 7B and 7C.

As in FIG. 6D, the first dielectric layer 40 may not extend continuously under the control layer 50 in one embodiment. Other embodiments may be similar to FIG. 6A where the first dielectric layer 40 extends continuously under the control layer 50.

Some of the advantages of the vertical electro-mechanical switching devices described in various embodiments will now be described. Advantageously, a configuration with drain up and source down simplifies contact formation and contacting the source and drain. Further, vertical integration of the spring function into the opening and the use of a vertical channel saves die area by reducing foot print and allows miniaturization beyond other conventional technologies. Besides the contact resistances, the ON resistance includes the source, channel, and drain resistance, which are all formed using metallic material. Accordingly, the ON resistance is significantly lower compared with other conventional technologies.

Further, unlike the embodiment of FIG. 6A, there is no increase in ON resistance due to the substrate resistance. Additionally, the overlap capacitances (miller capacitances) can be made to be much smaller. In conventional MOSFET devices, the overlap capacitance is correlated with the ON resistance and turn ON voltage. In contrast in the various embodiments of the vertical electro-mechanical devices, the gate to drain overlap capacitance can be designed to be negligible. In some of the embodiments, the source and drain are located on the same side of opening and hence result in no potential drop across the source or drain layer. If the drain and source are on opposite sides, a potential drop will reduce the pull in voltage needed to move the moveable electro-mechanical component 81.

Low mass of the structures implies that external device accelerations hardly generate sufficient force to overcome internal spring force of the moveable electro-mechanical component 81.

Referring to FIG. 7B, the first conductive layer 20 is contacted using multiple contacts 90A. Due to the smaller current being carried to the control layer 50, the control layer 50 may be contacted with a smaller number of contacts 90B.

As next illustrated in the side view of FIG. 7C, the first conductive layer 20 is isolated from the control layer 50 by the insulating layer 85 and the first dielectric layer 40. The contacts 90A to the first conductive layer 20 may be different from the contacts 90B to the control layer 50. In particular, the contacts 90A to the first conductive layer 20 may be longer than the contacts 90B to the control layer 50. However, in various embodiments, they may be fabricated at the same step using a common process.

Figure 8A:
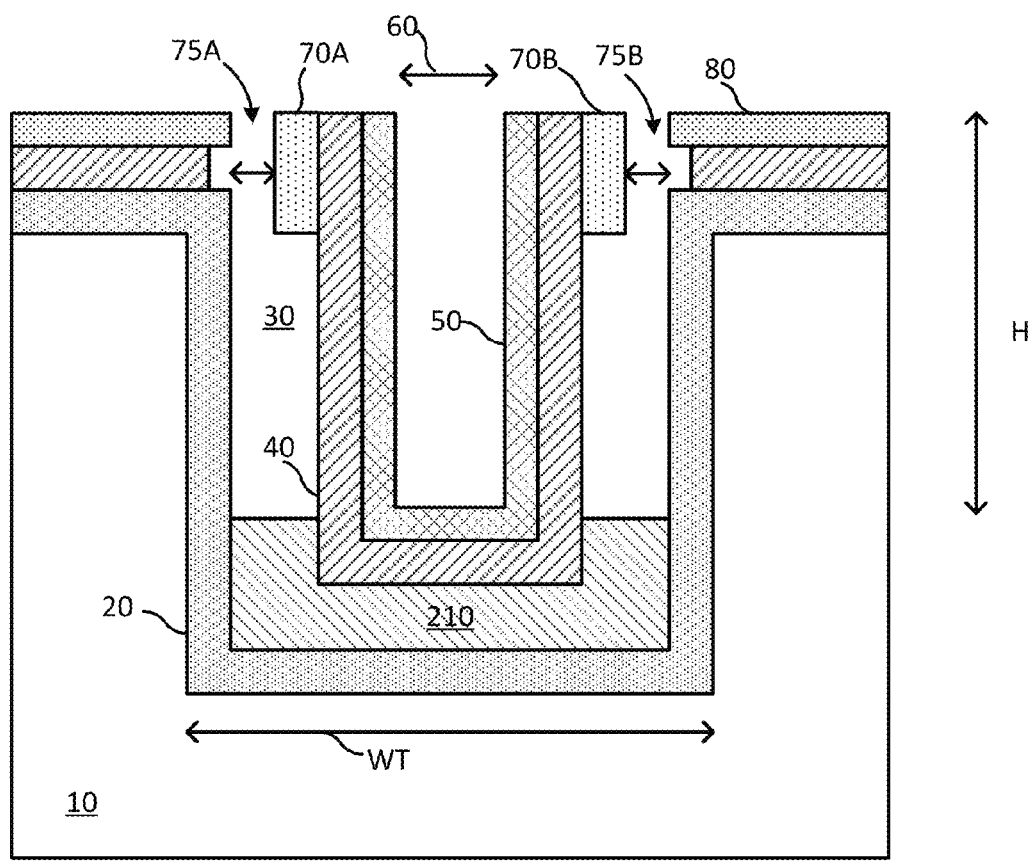
FIG. 8A illustrates a cross-sectional view of an electro-mechanical switching device having two moveable gate stacks in accordance with an alternative embodiment of the present invention.

FIG. 8A illustrates a cross-sectional view of an electro-mechanical switching device having two moveable gate stacks in accordance with an alternative embodiment of the present invention.

In further embodiments, the gate stack (or correspondingly the conductive channel) may be able to contact both sides of the opening sidewalls. Accordingly, two separate current paths may be established between the first conductive layer 20 and the third conductive layer 80. In such embodiments, the current density flowing through per opening is doubled. This advantage may be used to reduce the area of the device, for example.

As illustrated in FIG. 8A, the first dielectric layer 40 is embedded in a second dielectric layer 210 disposed within the opening. However, in this embodiment, a second conductive layer includes a first portion 70A and a second portion 70B. The first portion 70A and the second portion 70B of the second conductive layer may be electrically isolated or they may be electrically coupled.

The first portion 70A is separated from a left side portion of the third conductive layer 80 by a first source/drain to gate air gap 75A while the second portion 70B is separated from a right side portion of the third conductive layer 80 by a second source/drain to gate air gap 75B.

The aspect ratio of the opening (ratio of height H to width WT) is carefully selected to enable proper functioning of the device.

Figure 8B:
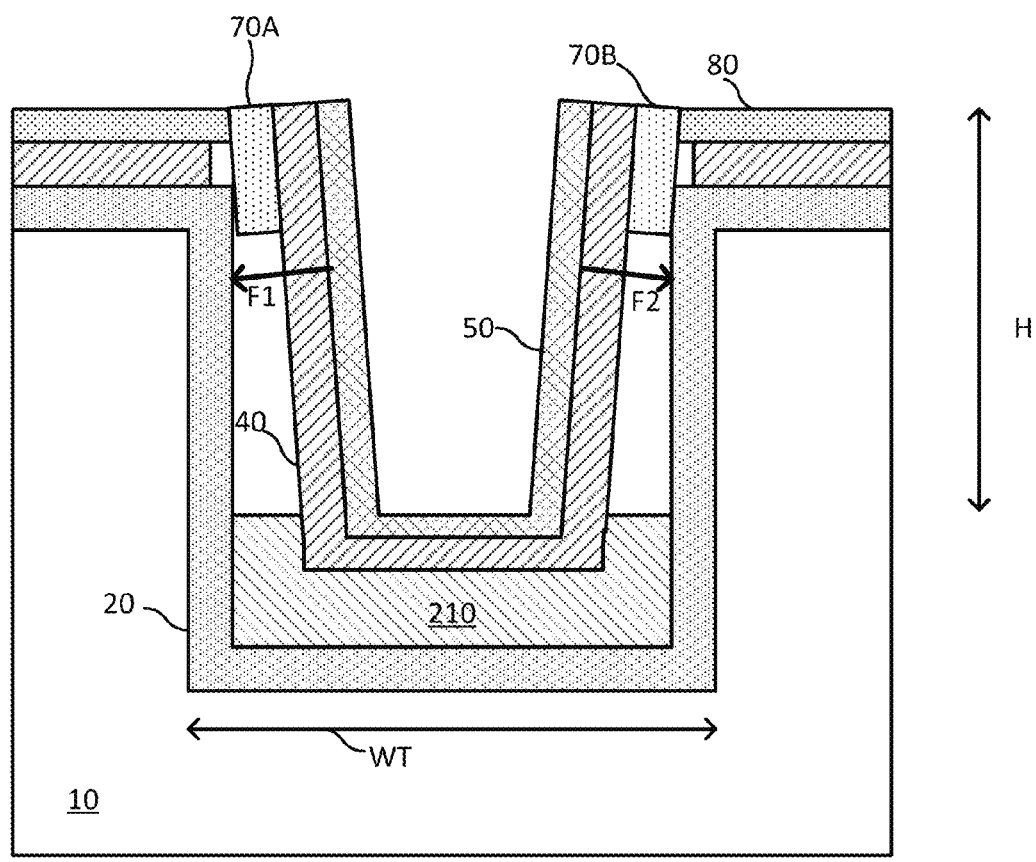
FIG. 8B illustrates a cross-sectional view of an electro-mechanical switching device having two moveable gate stacks in an ON state in accordance with an alternative embodiment of the present invention.

FIG. 8B illustrates a cross-sectional view of an electro-mechanical switching device having two moveable gate stacks in an ON state in accordance with an alternative embodiment of the present invention.

As described above, the gate stack is anchored at the bottom of the opening by the second dielectric layer 210. When the switching device is biased to the ON state, a first electrostatic force (F1) is generated between the left side of the control layer 50 with the left side of the first conductive layer 20 across the air gap 30 and a second electrostatic force (F2) is generated between the right side of the control layer 50 with the right side of the first conductive layer 20 across the air gap 30. In response to the first and the second electrostatic forces F1 and F2, the first portion 70A and the second portion 70B contact the first and the third conductive layers 20 and 80 resulting in two separate vertical current paths.

Figure 9A:
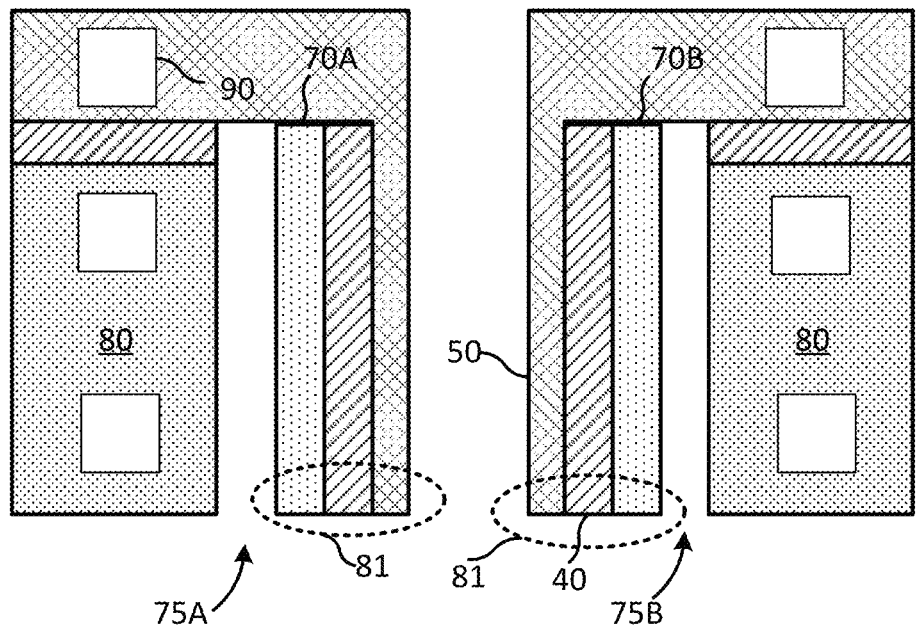
Figure 9B:
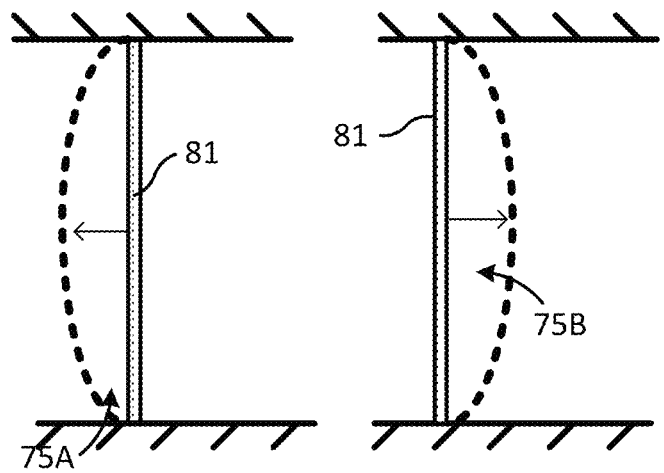
FIG. 9B illustrates a corresponding mechanical schematic showing the flexing of the moveable electro-mechanical component of the switching device.

FIG. 9A illustrates a top view of the switching device illustrated in FIG. 8A in one embodiment of the present invention. FIG. 9B illustrates a corresponding mechanical schematic showing the flexing of the moveable electro-mechanical component of the switching device.

Referring to FIG. 9A, in one embodiment, the moveable electro-mechanical component 81 comprising the control layer 50 may be flexible in a central region while both ends are fixed to sidewalls of the openings. This embodiment may be more practical in case the opening is a long trench. In such embodiments, as illustrated in FIG. 9B, the moveable electro-mechanical component 81 flexes outwards and the central region of the moveable electro-mechanical component 81 contacts the corresponding source and drain components to form a conductive current path. However, only the upward portion of the moveable electro-mechanical component 81 flexes outwards as illustrated because the lower portion is anchored by the second dielectric layer 210.

Figure 10A:
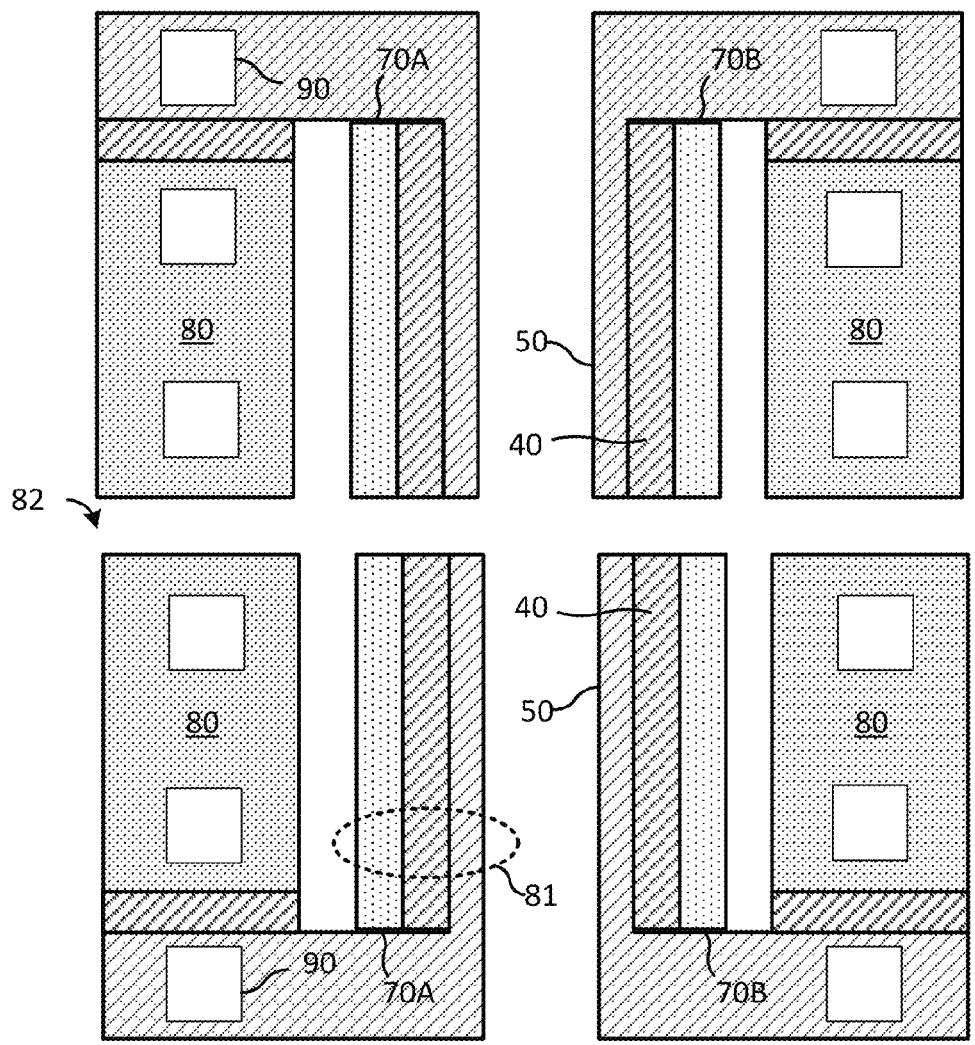
Figure 10B:
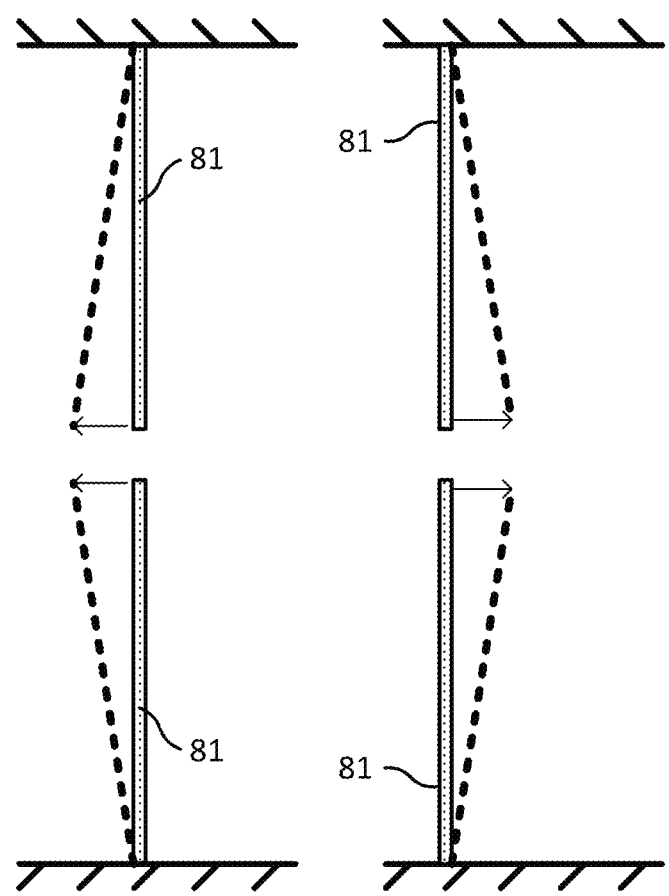
FIG. 10B illustrates a corresponding mechanical schematic showing the flexing of the moveable electro-mechanical component of the switching device.

FIG. 10A illustrates a top view of the switching device illustrated in FIG. 8A in one embodiment of the present invention. FIG. 10B illustrates a corresponding mechanical schematic showing the flexing of the moveable electro-mechanical component of the switching device.

In a further embodiment, the moveable electro-mechanical component 81 may be mechanically anchored from only one side. In such embodiments, a central opening 82 may separate the moveable electro-mechanical component 81 from an adjacent one. Accordingly, as illustrated in FIG. 10B, the ends of the moveable electro-mechanical component 81 flex outwards much more.

Figure 11A:
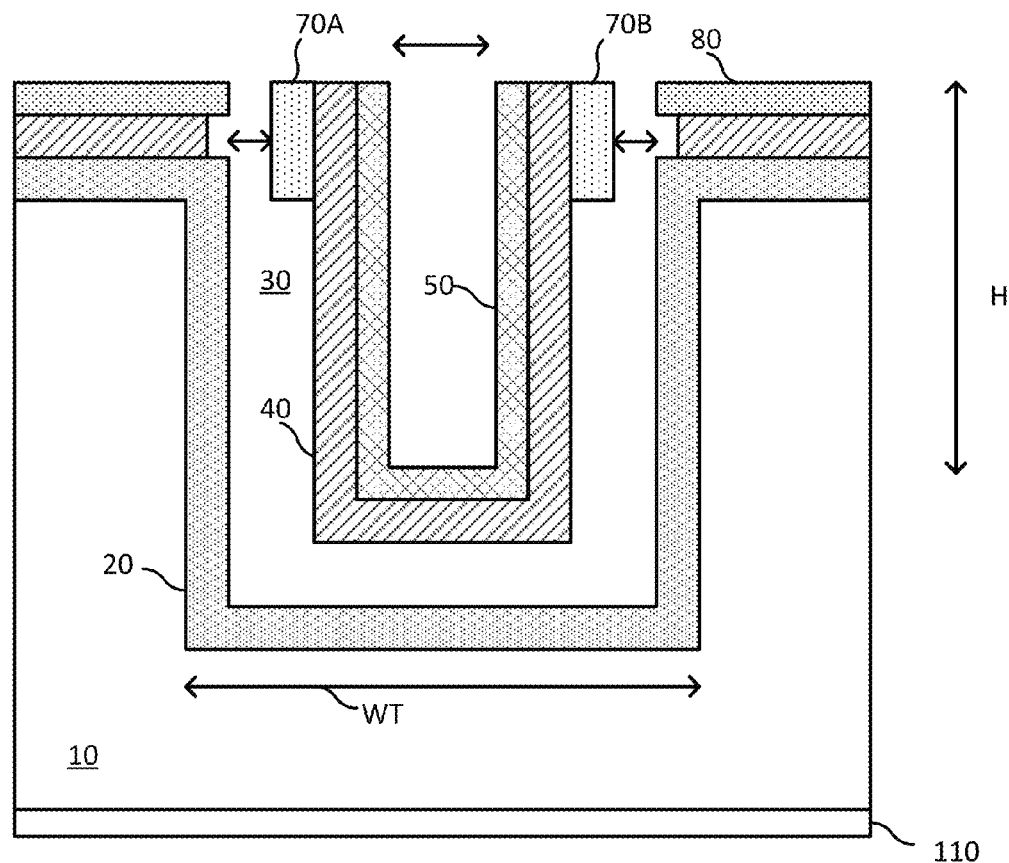
Figure 11B:
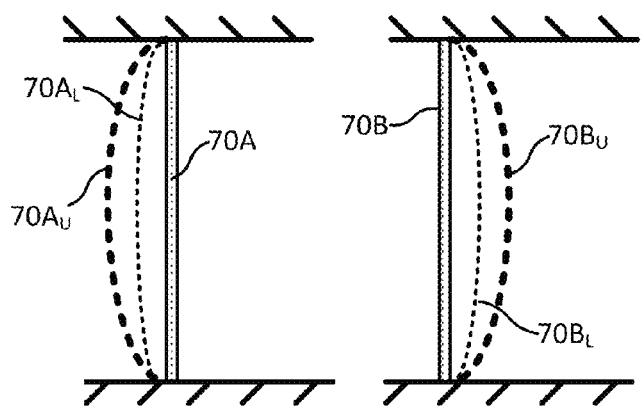
FIG. 11B illustrates a corresponding mechanical schematic showing the flexing of the moveable electro-mechanical component of the switching device.

FIG. 11A illustrates a top view of the switching device illustrated in FIG. 8A in one embodiment of the present invention. FIG. 11B illustrates a corresponding mechanical schematic showing the flexing of the moveable electro-mechanical component of the switching device.

In a further embodiment, the moveable stack may not be anchored to the bottom of the opening and anchored only at an end of the opening as in the embodiments illustrated in FIGS. 9 and 10 above. Instead, the freely suspended moveable stack is free to move for both the upper and lower portions. However, the displacement of the upper portions (shown as the dashed line $70A_U$ and $70B_U$) is likely to be more than the displacement of the lower portions (shown as the dashed line $70A_L$ and $70B_L$).

FIG. 12A illustrates a vertical electro-mechanical switch comprising a mesa within the opening in accordance with an embodiment of the present invention. FIG. 12A illustrates a cross-sectional view while FIG. 12B and FIG. 12C illustrate top sectional view of the vertical electro-mechanical switch of FIG. 12A.

Referring to FIG. 12A, in further embodiments, a mesa 151 is attached to the opening. The mesa 151 is coupled to the back side metallization 110 and therefore can be biased from the back side of the substrate 10. A first dielectric layer 40 is disposed over the substrate 10.

A first conductive layer 20 is disposed over the first dielectric layer 40. Accordingly, in this embodiment, the first conductive layer 20 is isolated from the substrate 10. Thus, a plurality of closely packed switching cells 300 may be formed to next to each other. Adjacent switching cells 300 are, however, coupled through the common control (mesa 151), which is coupled to the common substrate 10.

A third dielectric layer 41 is disposed over the first conductive layer 20. A third conductive layer 80 is disposed over the third dielectric layer 41.

The first dielectric layer 40 and the third dielectric layer 41 may comprise a same material in one embodiment.

The switching operation of this embodiment is similar to the prior embodiments. The moveable component comprising the mesa 151, the fourth dielectric layer 42, and the second conductive layer 70 tilts towards the first conductive layer 20 and the third conductive layer 80.

The vertical electro-mechanical switch of this embodiment may be a three terminal or a four terminal device. As illustrated in the top sectional view of FIG. 12B and FIG. 12C, a body plate 152 may be formed over a substantially large area to maximize the electrostatic pull of the moveable stack when the bias is switched to the ON state.

As illustrated in FIGS. 12B and 12C, the second conductive layer 70 does not cover all of the mesa 151 to prevent shielding of the electrostatic force between the mesa 151 and the body plate 152. Additionally, the second conductive layer 70 is designed to avoid shorts between the second conductive layer 70 to the body plate 152 when in the ON state. Otherwise, the device will have a source (or drain) to body leakage current in the ON state. Accordingly, a guard gap GG is added between the second conductive layer 70 and the body plate 152.

Figure 13A:
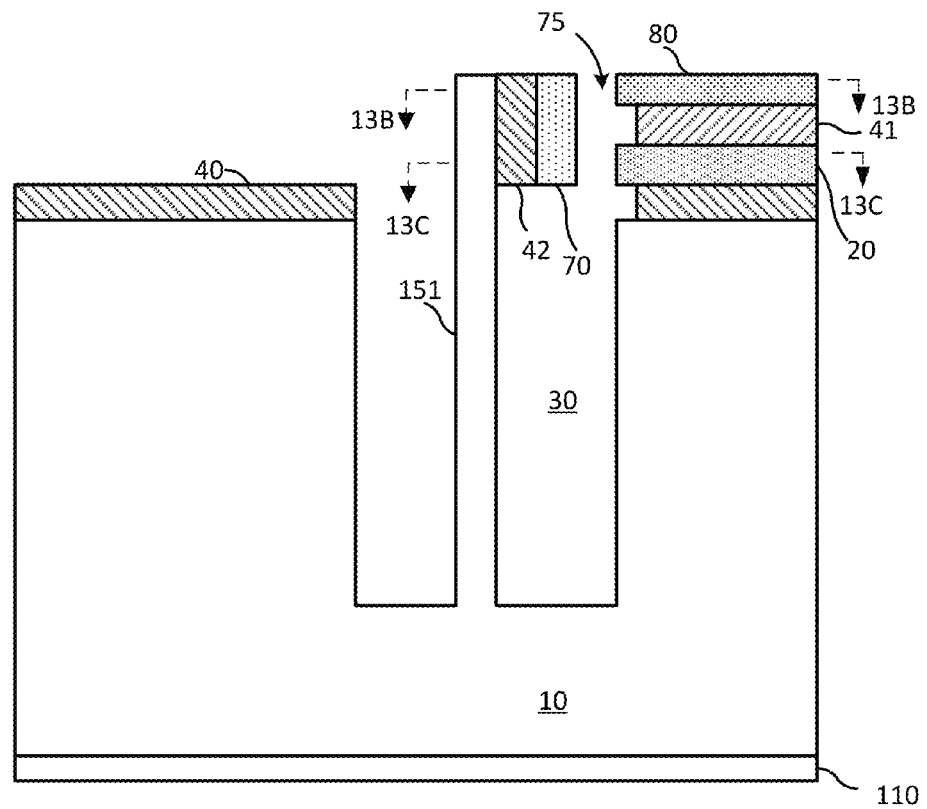
Figure 13B:
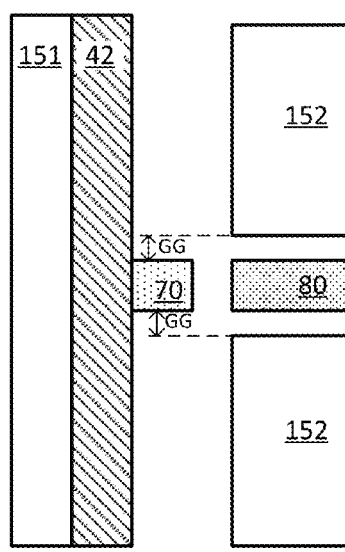
FIG. 13B and FIG. 13C illustrate top sectional view of the vertical electro-mechanical switch of FIG. 13A.
Figure 13C:
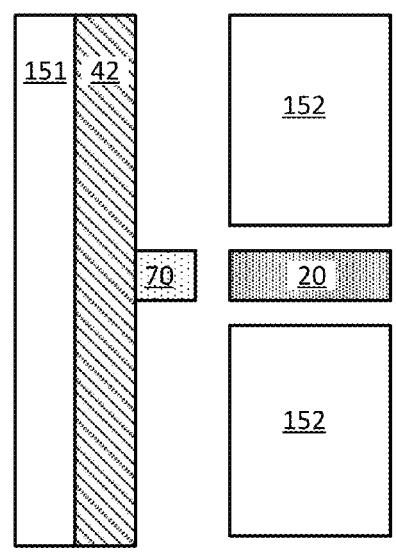

FIG. 13A illustrates a vertical electro-mechanical switch comprising a mesa within the opening in accordance with an embodiment of the present invention. FIG. 13A illustrates a cross-sectional view while FIG. 13B and FIG. 13C illustrate top sectional views of the vertical electro-mechanical switch of FIG. 13A.

This embodiment is similar to FIG. 12A-12C except for the relative arrangement of the body plate 152 and the first and the third conductive layers 20 and 80. In this embodiment, the first and the third conductive layers 20 and 80 are centrally located to ensure maximum contact with the moveable second conductive layer 70, which is attached to the mesa 151.

Figure 14A:
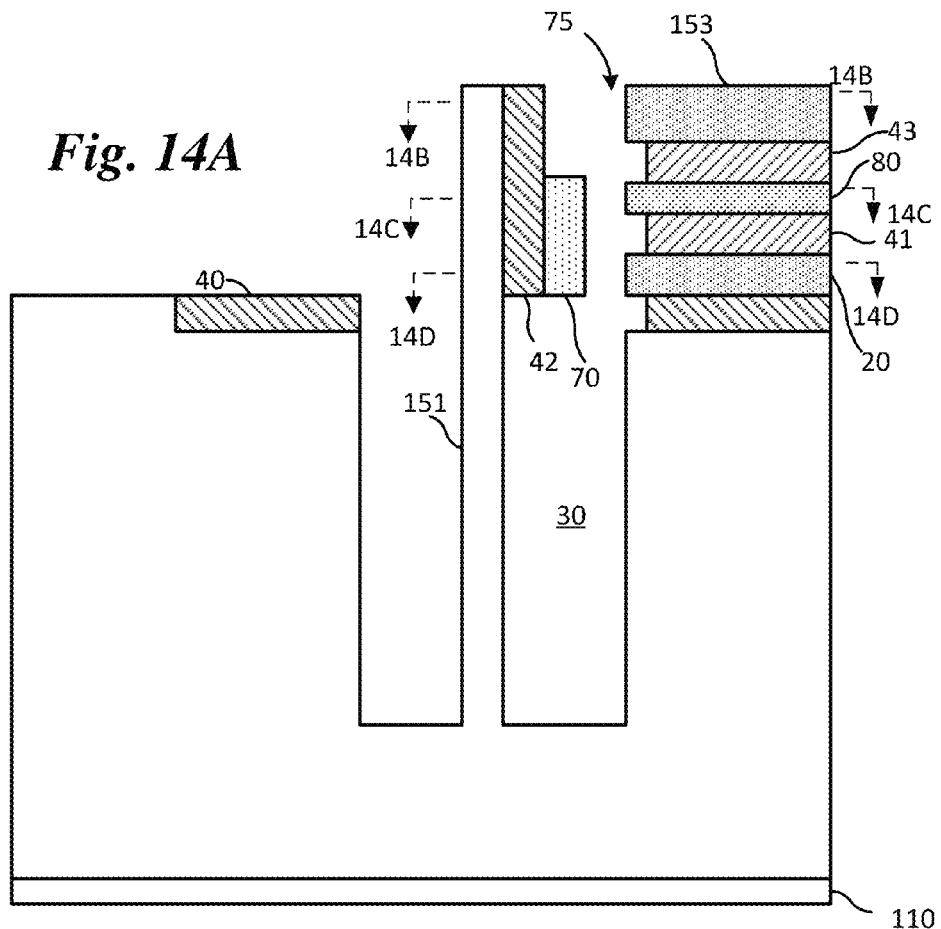
Figure 14B:
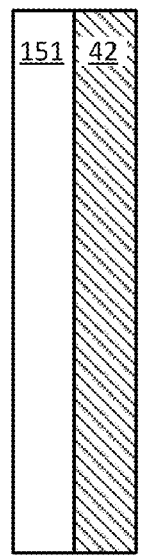
Figure 14B:
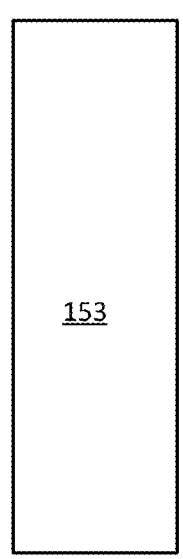
Figure 14C:
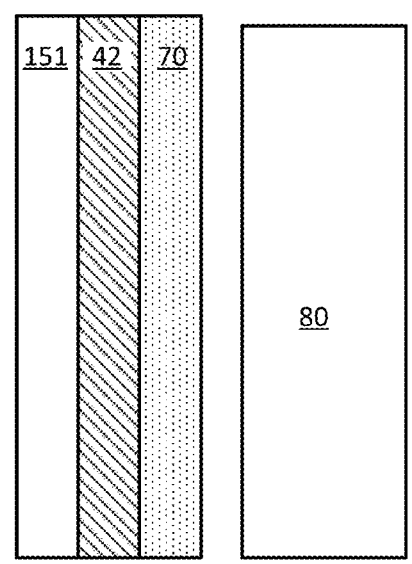
Figure 14D:
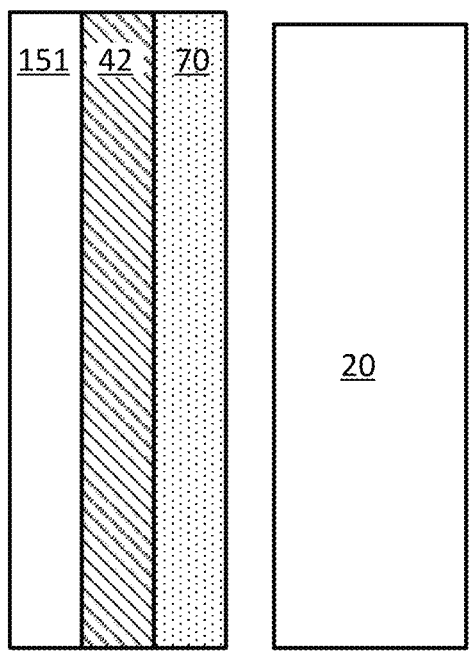

FIGS. 14A-14D illustrate a vertical electro-mechanical switch comprising a mesa within the opening in accordance with an embodiment of the present invention. FIG. 14A illustrates a cross-sectional view while FIGS. 14B-14D illustrate top sectional views of the vertical electro-mechanical switch of FIG. 14A.

In this embodiment, a fifth dielectric layer 43 is formed over the third conductive layer 80, and a fourth conductive layer 153 is formed over the fifth dielectric layer 43. The fourth conductive layer 153 may be coupled to a body node and therefore serves as the body of the device. The mesa 151 is pulled towards the fourth conductive layer 153.

Figure 15A:
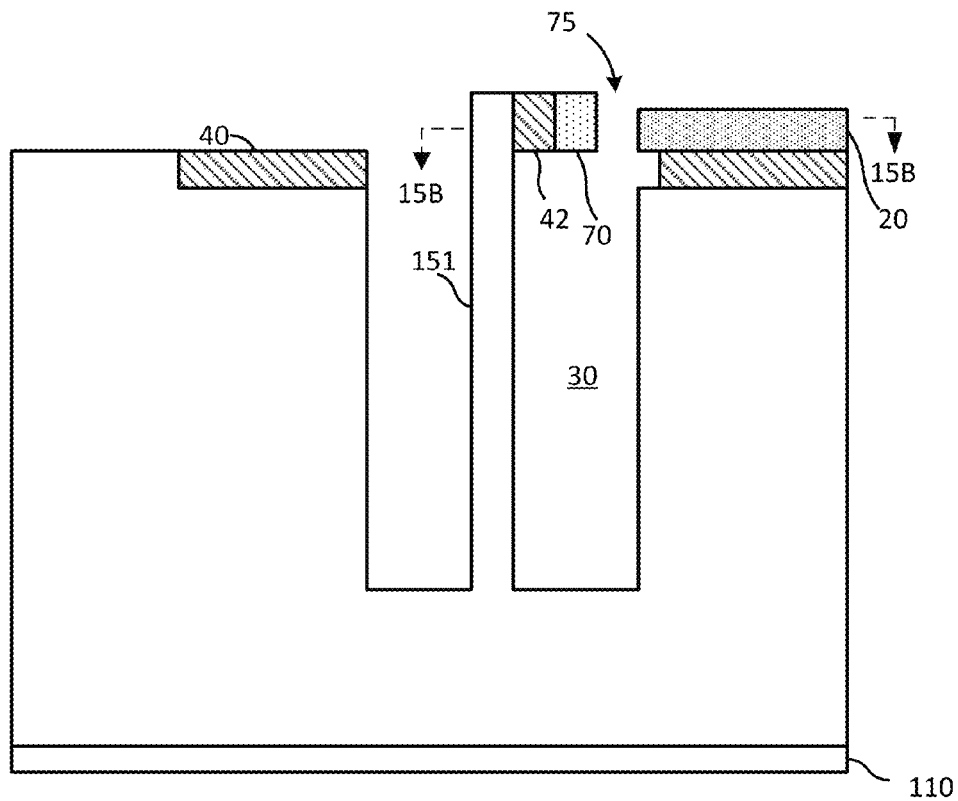
Figure 15B:
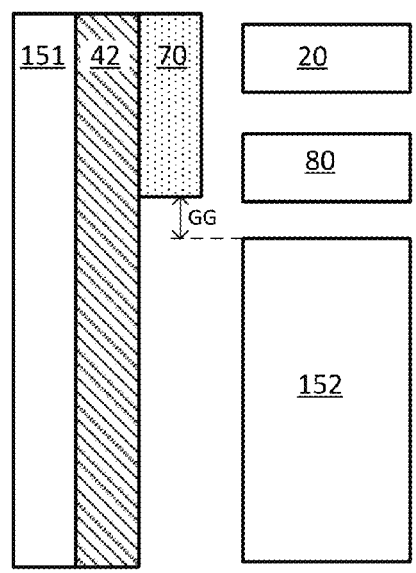

FIGS. 15A-15B illustrate a vertical electro-mechanical switch comprising a mesa within the opening in accordance with an embodiment of the present invention. FIG. 15A illustrates a cross-sectional view while FIG. 15B illustrates a top sectional view of the vertical electro-mechanical switch of FIG. 15A.

In another embodiment, the source, body and drain may be located side by side and may not be stacked on top of each other. Accordingly, as best illustrated in the top sectional view of FIG. 15B, the first and the third conductive layers 20 and 80 and the body plate 152 are in the same plane, e.g., formed in the same metal level of a metallization layer. As in prior embodiment, the second conductive layer 70 occupies only a small area to prevent shielding between the mesa 151 and the body plate 152 as well as to avoid shorting between the body plate 152 and the second conductive layer 70.

Figure 16A:
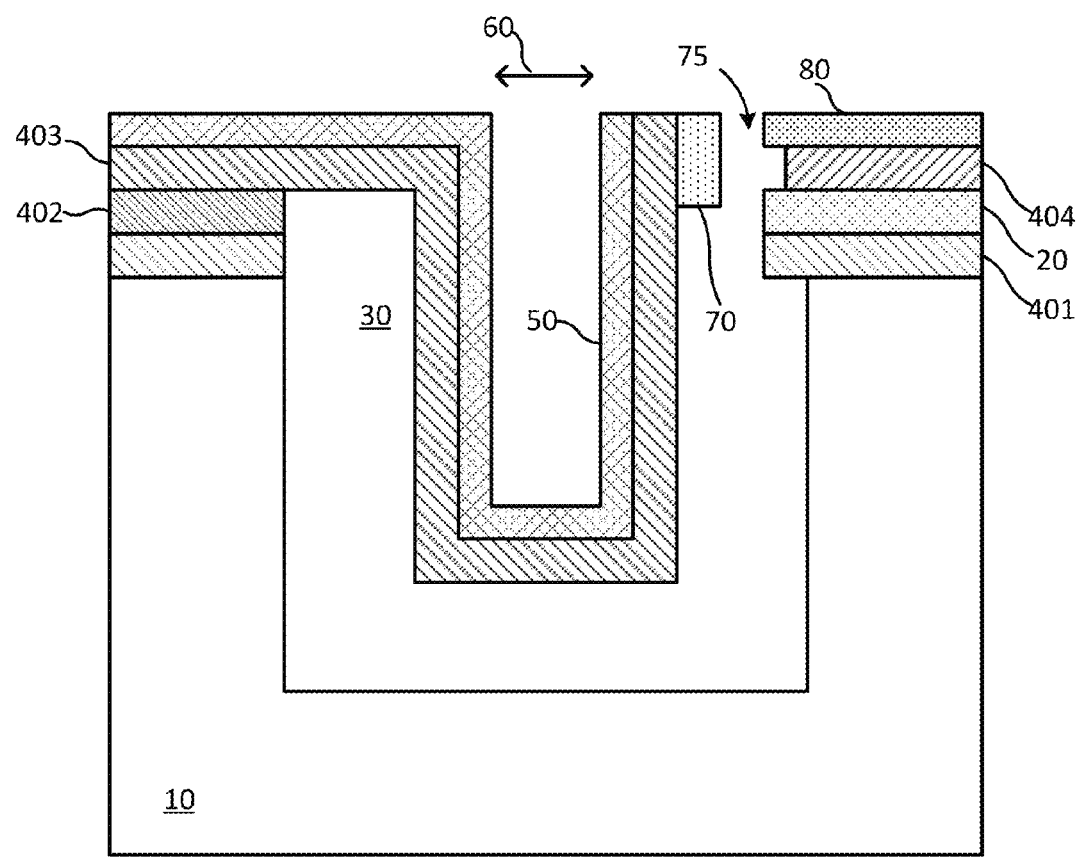
FIG. 16A illustrates a cross-sectional view of a three terminal vertical electro-mechanical switch in accordance with an embodiment of the present invention.

FIG. 16A illustrates a cross-sectional view of a three terminal vertical electro-mechanical switch in accordance with an embodiment of the present invention.

FIG. 16A illustrates a three terminal device in which the capacitance between the gate and the source is increased in accordance with an embodiment of the present invention.

In one embodiment, the overlap of the second conductive layer 70 and the first conductive layer 20 is minimized to prevent the second conductive layer 70 from shielding the control layer 50. This may be accomplished by forming a first intermediate dielectric layer 401 and a second intermediate dielectric layer 402, which are subsequently removed in the opening to form the air gap 30.

A third intermediate dielectric layer 403 is formed over the second intermediate dielectric layer 402. The control layer 50 is disposed on the third intermediate dielectric layer 403. The third conductive layer 80 is separated from the first conductive layer 20 by the fourth intermediate dielectric layer 404.

Figure 16B:
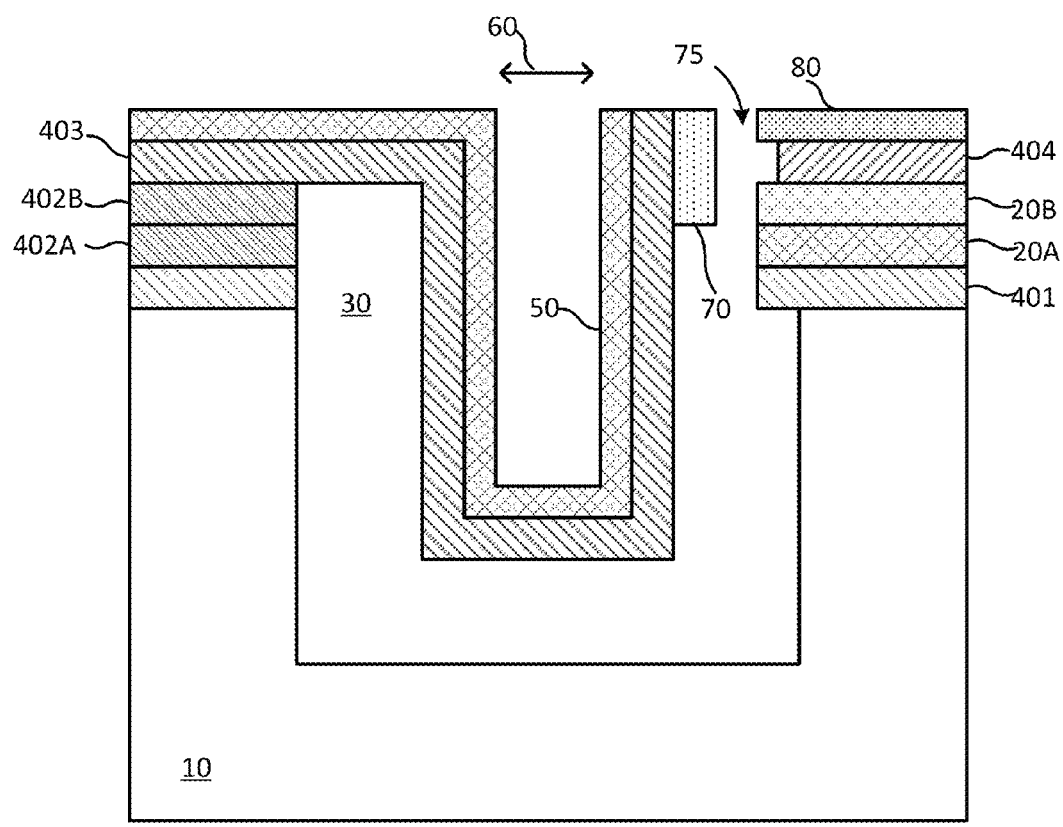
FIG. 16B illustrates a three terminal device in which the capacitance between the gate and the source is increased by increasing the source metal thickness in accordance with an embodiment of the present invention.

FIG. 16B illustrates a three terminal device in which the capacitance between the gate and the source is increased by increasing the source metal thickness in accordance with an embodiment of the present invention.

In this embodiment, the thickness of the source metal may be increased to increase the electrostatic force between the control layer 50 and the source, which includes a first conductive layer comprising a first layer 20A and second layer 20B. For illustration, the second intermediate dielectric layer may include one or more layers such as the first insulating layer 402A and the second insulating layer 402B.

Figure 17:
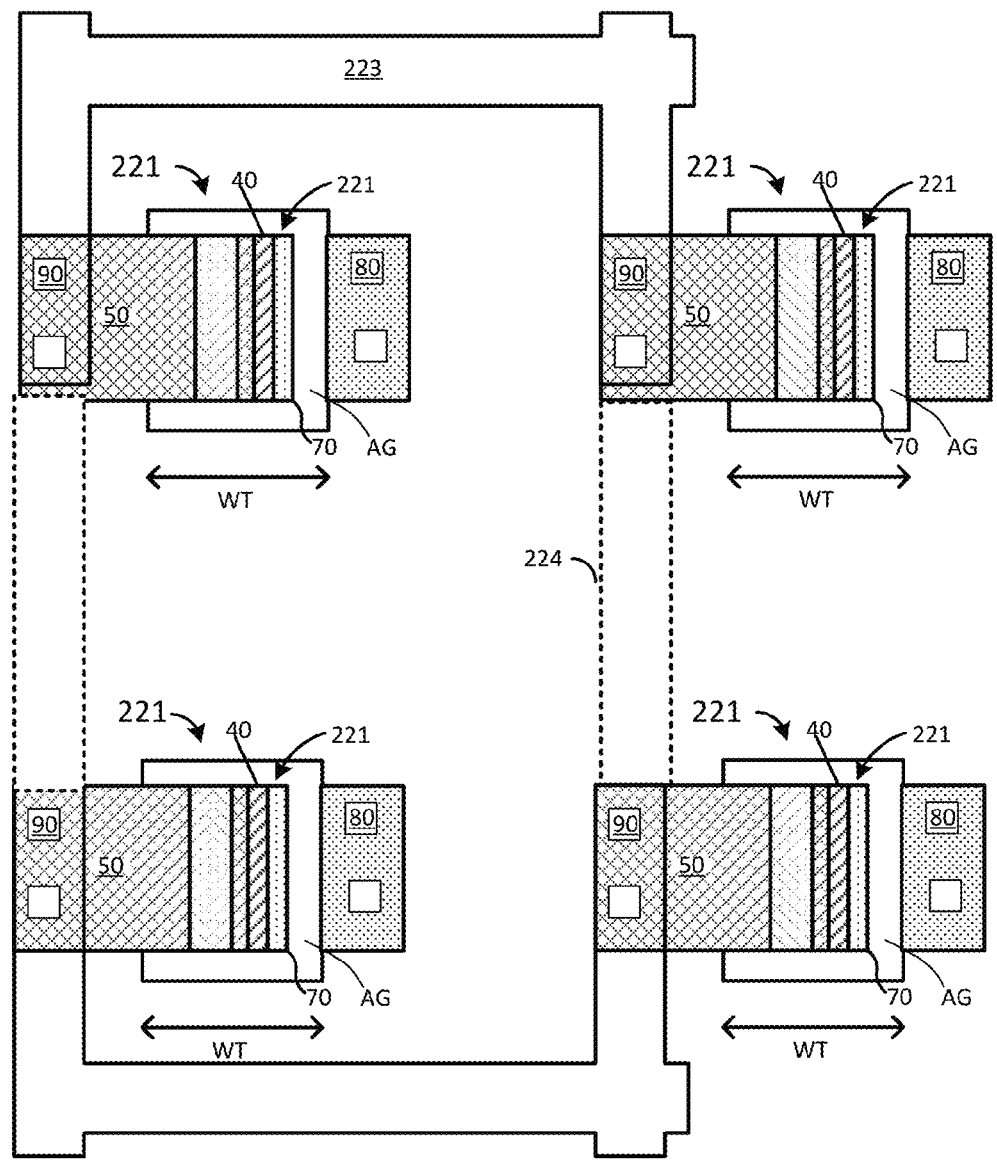
FIG. 17 illustrates a portion of an integrated circuit formed using the moveable electro-mechanical components in accordance with an embodiment of the present invention.

FIG. 17 illustrates rectangular opening forming the moveable electro-mechanical components in accordance with an embodiment of the present invention.

Embodiments of the present invention may be formed as square or rectangular openings. This embodiment may be used to form standard cell circuits including integrated circuits used in logic, memory such as SRAM as well as a select/access transistor in other memory architectures, and other applications. In one or more embodiments, the switching devices described in various embodiments may be made to behave as NMOS or PMOS devices by simply changing the bias conditions applied at the various nodes. For example, the behavior of a PMOS transistor is obtained by applying a negative gate to body (or gate to source) voltage and a negative drain to source voltage, e.g., source and optionally body at ground and drain is at −VDD while the gate is biased to −VDD (or other negative voltage). Accordingly, when a large negative bias in applied on the gate, the moveable channel is attracted to the source (or body) and forms a conductive path between the drain and source. In contrast, the behavior of a NMOS transistor is obtained by applying a positive gate to body (or gate to source) voltage ($+V_{GS}$) and a positive drain to source voltage ($+V_{DS}$). Accordingly, when a large positive bias in applied on the gate, the moveable channel is attracted to the source (or body) and forms a conductive path between the drain and source.

An array of rectangular switching cells 221 are formed as described in various embodiments. Each of the rectangular switching cell 221 comprise a rectangular moveable electro-mechanical component 222 as described in various embodiments separated from one or more conductive layers such as the third conductive layer 80 by an air gap AG.

In various embodiments, particular care is taken to avoid anchoring the moveable electro-mechanical component 222. If the moveable electro-mechanical component 222 are oriented along a first direction, contacting between gate contacts in the first direction have to performed through upper metallization layers. For example, a cover layer is formed without compromising the air gap AG. Metal levels may be formed over such a cover layer. See FIG. 18 for illustration of such a cover layer. As illustrated in FIG. 17, an upper metal line 223 may connect adjacent gates oriented in the direction of the gate line.

In contrast, adjacent gates in adjacent rows may be connected either within the same metal level as the gate lines or in an upper metal level. For example, FIG. 17 illustrates a interconnect 224 in the same level as the control layer 50 connecting gates in adjacent cells 221.

The embodiment of FIG. 17 is applicable to any of the embodiments described above.

Figure 18:
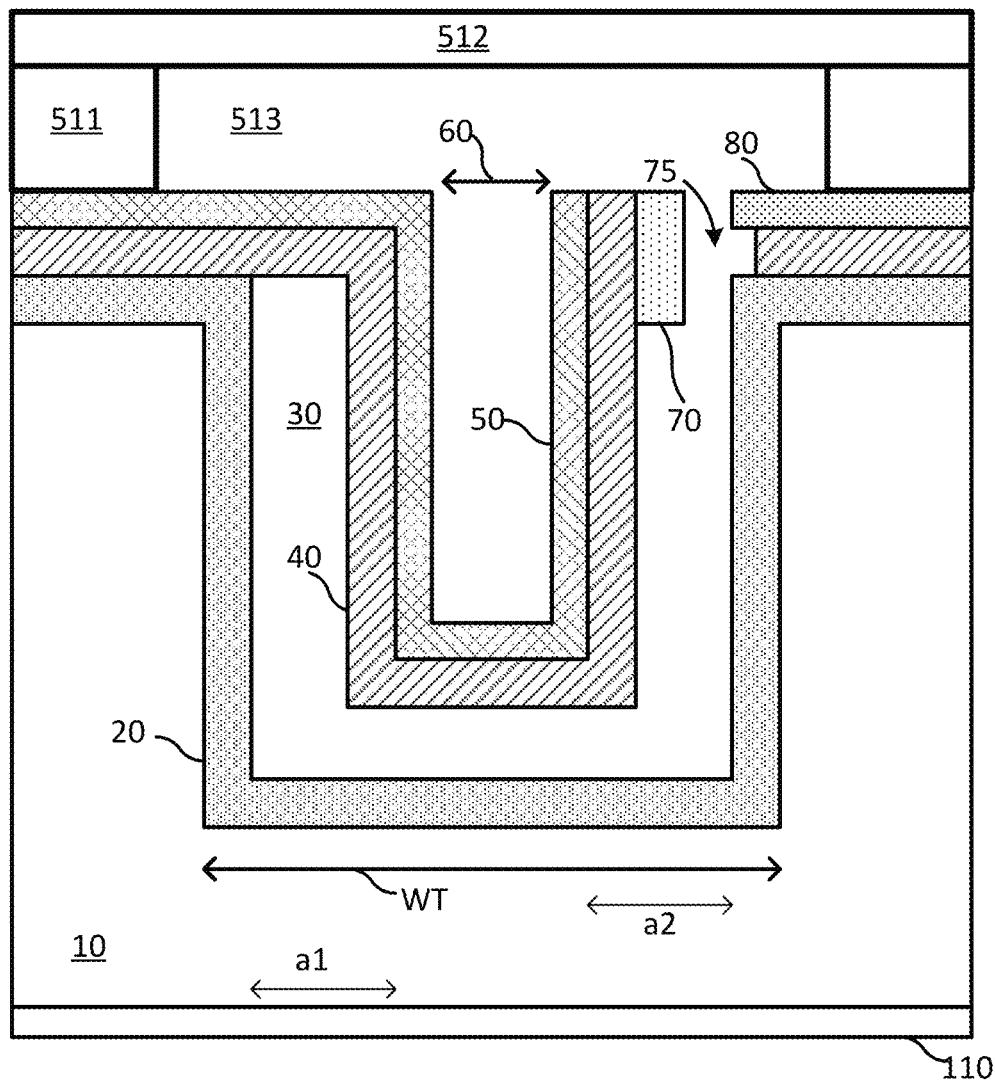
FIG. 18 illustrates a cross-sectional view of a vertical electrical-mechanical switch device with a capping layer in accordance with an embodiment of the present invention.

FIG. 18 illustrates a cross-sectional view of a vertical electrical-mechanical switch device with a capping layer in accordance with an embodiment of the present invention.

In various embodiments, the vertical electrical-mechanical switching device described in any of the prior embodiments is capped for proper functioning of the switching device. Otherwise, moisture, dust, and other particles would enter into the cavity preventing the moveable component from moving.

FIG. 18 illustrates one way of capping the vertical electrical-mechanical switching device. An interposer structure 511 is formed over the substrate 10. The interposer structure 511 is designed to be surround the opening from all directions and designed to increase/extend the height of the opening.

A cap 512 is attached to the interposer structure 511 so that the cavity 513 is fully enclosed sealing the source/drain-channel gap 75 and the air gap 30. Additionally, in some embodiments, the source/drain-channel gap 75 and the air gap 30 may be evacuated and a different gas introduced prior to the capping. In one exemplary embodiment, a gas filling (e.g., $SF_6$) could be used to reduce spark formation and avoid related reliability issues.

In some embodiments, the interposer structure 511 and the cap 512 are made of the same material. The integrated structure comprising the interposer structure 511 and the cap 512 may be attached to the substrate 10 using conventional techniques.

Figure 19A:
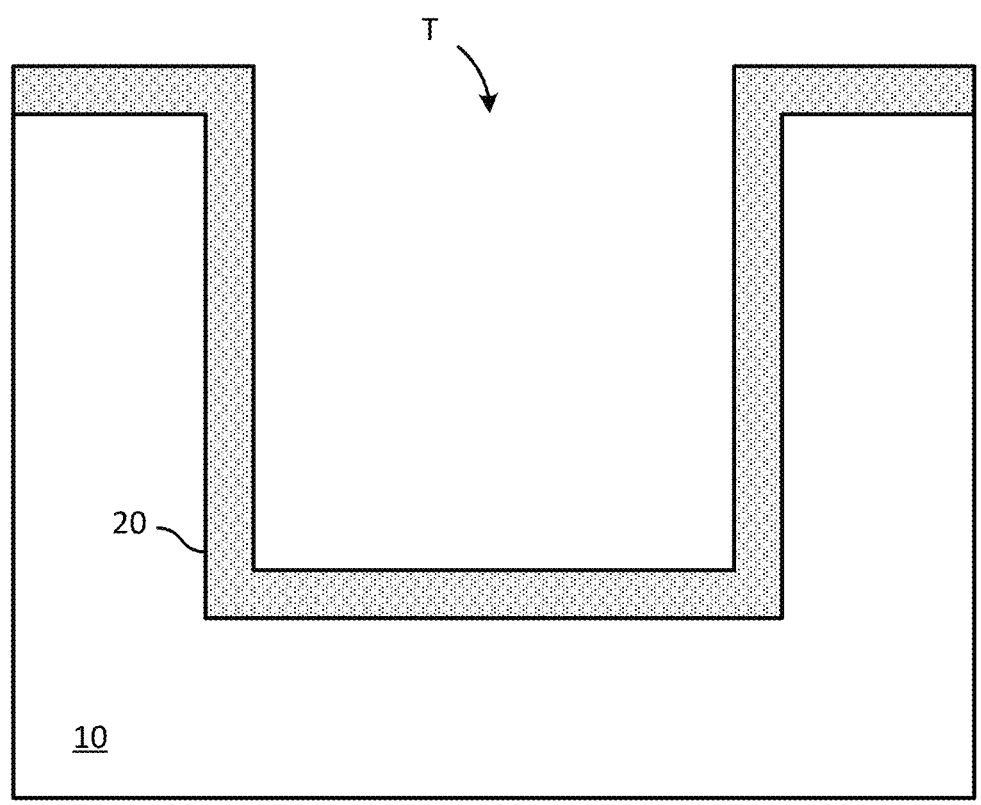
FIGS. 19A-19B illustrate cross-sectional views of a vertical electro-mechanical switching device during fabrication in accordance with an embodiment of the present invention.
Figure 19B:
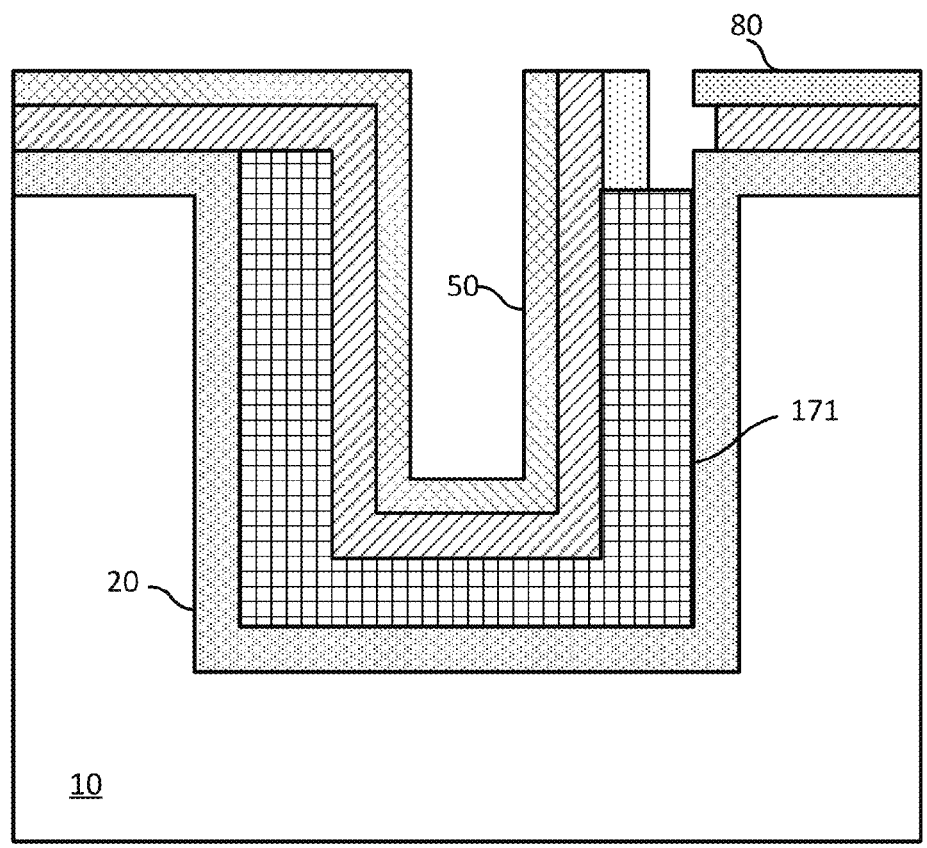

FIGS. 19A-19B illustrate cross-sectional views of a vertical electro-mechanical switching device during fabrication in accordance with an embodiment of the present invention.

Referring to FIG. 19A, an opening T is formed within the substrate 10. The substrate 10 may be a silicon substrate in one embodiment. Alternatively, in other embodiments, the substrate 10 may be silicon carbide (SiC). In one embodiment, the substrate 10 may comprise gallium nitride (GaN). In alternative embodiments, the substrate 10 may comprise semiconductor on insulator substrates such as SOI as well as compound semiconductors such as GaAs, InP, InSb, SbInP, and others. In further embodiments, the substrate 10 may be a metallic material and may include a tungsten substrate as an example.

The substrate 10 may include epitaxial layers including heteroepitaxial or homoepitaxial layers. Some examples of the substrate 10 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide, or others can be used as the substrate 10.

In embodiments, in which, there is no current path or current flow through the substrate 10 (e.g., FIGS. 16A-16B), the substrate 10 may also comprise an insulating material. Examples of such insulating substrates include quartz substrate and other refractory materials.

The opening T may be a trench or a cylindrical/rectangular opening. The opening T may be formed using conventional lithography techniques, for example, by depositing a hard mask, a photoresist, developing the photoresist after exposure, and patterning the hard mask. Using the hard mask as an etch mask, the opening T is formed.

A first conductive layer 20 is deposited over the substrate 10 including the open sidewalls and bottom surface of the opening T. The first conductive layer 20 may be deposited using a conventional deposition process including a sputtering, physical vapor deposition, chemical vapor deposition, evaporation, atomic layer deposition, printing, and others. The first conductive layer 20 comprises a metal and may include tungsten, titanium, tantalum, aluminum, ruthenium, cobalt, nickel, silicides thereof, conductive nitrides, and conductive carbides thereof. The first conductive layer 20 may comprise multiple layers such as a metallic liner and/or barrier layer followed by a metal deposition.

Referring to FIG. 19B, a sacrificial layer 171 is formed within the opening T. The sacrificial layer 171 may comprise a material that can be easily etched with good selectivity with the first conductive layer 20 and the subsequently formed first dielectric layer 40. For example, if the first dielectric layer 40 comprises silicon nitride, the sacrificial layer 171 may comprise silicon oxide. Similarly, for example, if the first dielectric layer 40 comprises silicon oxide, the sacrificial layer 171 may comprise silicon nitride. In other embodiments, the sacrificial layer 171 may comprise a other dielectric materials including spin on glass and other low-k dielectric such as amorphous materials including amorphous carbon, hydrogenated silicon (Si:H), hydrogenated silicon oxide (SiO:H), hydrogenated silicon nitride (SiN:H), and others.

Subsequent layers are formed over the sacrificial layer 171. For example, the first dielectric layer 40, the control layer 50, the second conductive layer 70, and the third conductive layer 80 may be all formed using lithography, deposition, etch, silicidation, processes. Contacts pads and other structures may also be formed. Back side metallization if needed is also performed.

In one embodiment, the first conductive layer 20, the second conductive layer 70 and/or the third conductive layer 80 may comprise a silicide material such as titanium silicide, nickel silicide, cobalt silicide. In further embodiments, the bulk conducting materials for the first conductive layer 20, the second conductive layer 70 and/or the third conductive layer 80, which may comprise semiconductor materials such as poly silicon or metallic materials such as tungsten, may be coated with a thin protective dielectric layer, e.g., $TiO_2$ for reduction of stiction related failures or spark formation.

Subsequently, after the completion of process steps, the sacrificial layer 171 is removed in a release etch. The release etch is designed to result in forming a moveable component. As described above, the release etch does not remove the underlying first conductive layer 20 and the overlying first dielectric layer 40 in some embodiments. However, in some embodiments, the selectivity towards the first dielectric layer 40 may be lower and some of the first dielectric layer 40 may be removed. This may be advantageous as described above with respect to FIG. 6D.

A sealing process may be used to seal and cap the formed electro-mechanical device.

One general aspect includes a switching device includes a first opening disposed in a substrate. A first source is disposed adjacent the first opening and having a contact surface parallel to sidewalls of the first opening. A first drain is disposed adjacent the first opening and has a contact surface parallel to the sidewalls of the first opening. A first moveable gate stack includes a first channel and a first gate disposed within the first opening. Implementations may include one or more of the following features. The switching device may further include a body disposed adjacent the first opening and having a contact surface parallel to the sidewalls of the first opening. The switching device where the switching device includes an on state and an off state, and where the first moveable gate stack is configured to be pulled towards the body in the on state. The switching device where the switching device includes an on state and an off state, and where the first moveable gate stack is configured to be pulled towards the first source in the on state. The switching device where the switching device includes an on state and an off state, where the switching device is configured to conduct in an on state, where, in the off state, the first moveable gate stack is in a first reference position, where, in the on state, the first moveable gate stack is displaced from the first reference position and contacts the first source and the first drain so that a first conduction path between the first source and the first drain is provided by the first channel. The switching device where the first moveable gate stack is elastically coupled to a sidewall of the first opening. The switching device where the first moveable gate stack is elastically coupled to a bottom surface of the first opening. The switching device where the first moveable gate stack includes an elastic component. The switching device may further include a source contact pad coupled to the first source; and a drain contact pad coupled to the first drain, where the source contact pad and the drain contact pad are disposed over the same side of the substrate. The switching device may further include a source contact pad coupled to the first source; and a drain contact pad coupled to the first drain, where the source contact pad and the drain contact pad are disposed over the opposite sides of the substrate. The switching device may further include a second opening disposed in the substrate; a second source disposed adjacent the second opening and having a contact surface parallel to sidewalls of the second opening; a second drain disposed adjacent the second opening and having a contact surface parallel to sidewalls of the second opening; and a second moveable gate stack including a second channel and a second gate disposed within the second opening. The switching device where the first source and the second source are coupled to a common source node, and where the first drain and the second drain are coupled to a common drain node. The switching device where the first source and the second source are separated by a common region of the substrate.

Another general aspect includes a switching device including an opening disposed in a substrate including a first sidewall and an opposite second sidewall, a source disposed in and/or over the opening, a drain disposed in and/or over the opening, and a channel disposed in the opening. The channel includes a first moveable conductive element having a first position and a second position. In the first position, the first moveable conductive element is configured to contact the first drain region and the source. In the second position, the first moveable conductive element is configured to be separated from the first drain region and the source by a first air gap. Implementations may include one or more of the following features. The switching device may further include a dielectric layer disposed over the source, the dielectric layer including a first major surface and an opposite second major surface; a second air gap disposed between the source and the dielectric layer; and a gate disposed along the first major surface of the dielectric layer. The switching device where the channel is disposed along the second major surface of the dielectric layer. The switching device where the source disposed along a first portion of the first sidewall of the opening, where the drain including a first drain region disposed along a second portion of the first sidewall of the opening, where the source is further disposed along a first portion of the second sidewall of the opening, where the drain includes a second drain region disposed along a second portion of the second sidewall of the opening. The switching device where the channel includes a second moveable conductive element having a first position and a second position. In the first position, the second moveable conductive element is configured to contact the second drain region and the source, where, in the second position, the second moveable conductive element is configured to be separated from the second drain region and the source by a second air gap. The switching device where the channel is mechanically coupled to a gate anchored to a bottom surface of the opening. The switching device where the substrate includes a semiconductor or a metallic substrate. The switching device may further include an isolating dielectric layer disposed over the major surface of the semiconductor substrate, where the source is electrically isolated from the drain by the isolating dielectric layer.

Another general aspect includes an integrated circuit includes a plurality of switching devices. Each switching device of the plurality of switching devices includes an opening disposed in a substrate, a source region, a drain region, a gate line oriented along a first direction including a moveable conductive element disposed within the opening. The moveable conductive element is configured to contact the source region and the drain region in a first state of the switching device and configured to be isolated from the source region and the drain region in a second state of the switching device. The plurality of switching devices is arranged in rows along the first direction and columns along a second direction perpendicular to the first direction. A first gate line of one of the plurality of switching devices is coupled to an adjacent second gate line of another of the plurality of switching devices in the same row by a conductive line in a metal level above the first gate line. Implementations may include one or more of the following features. The circuit where the first gate line is coupled to an adjacent third gate line in the same column by a conductive line in a same level as the first gate line. The circuit where the opening is rectangular. The circuit where the integrated circuit may include a CMOS device. The circuit where the integrated circuit may include a memory device.

As described in various embodiments, a material that comprises a metal may, for example, be a pure metal, a metal alloy, a metal compound, semimetal, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1A-18B may be combined with each other in alternative embodiments. It is therefore intended that the appended claims encompass any such modifications or embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A switching device comprising:
   a first opening disposed in a substrate comprising a major surface, the first opening extending into the substrate along a first direction from the major surface;
   a first source disposed adjacent the first opening and having a contact surface parallel to sidewalls of the first opening;
   a first drain disposed adjacent the first opening and having a contact surface parallel to the sidewalls of the first opening;
   a dielectric layer disposed between the first source and the first drain, the dielectric layer isolating the first source from the first drain; and
   a first moveable gate stack comprising a first channel and a first gate disposed within the first opening, wherein the switching device comprises an ON state and an OFF state, and wherein, in the ON state, the switching device is configured to conduct a current parallel to the first direction.

2. The switching device of claim 1, further comprising a body disposed adjacent the first opening and having a contact surface parallel to the sidewalls of the first opening.

3. The switching device of claim 2, wherein the first moveable gate stack is configured to be pulled towards the body in the ON state.

4. The switching device of claim 1, wherein the first moveable gate stack is configured to be pulled towards the first source in the ON state.

5. The switching device of claim 1, wherein, in the OFF state, the first moveable gate stack is in a first reference position, wherein, in the ON state, the first moveable gate stack is displaced from the first reference position and contacts the first source and the first drain so that a first conduction path between the first source and the first drain is provided by the first channel.

6. The switching device of claim 1, wherein the first moveable gate stack is elastically coupled to a sidewall of the first opening.

7. The switching device of claim 1, wherein the first moveable gate stack is elastically coupled to a bottom surface of the first opening.

8. The switching device of claim 1, wherein the first moveable gate stack comprises an elastic component.

9. The switching device of claim 1, further comprising:
   a source contact pad coupled to the first source; and
   a drain contact pad coupled to the first drain, wherein the source contact pad and the drain contact pad are disposed over the same side of the substrate.

10. The switching device of claim 1, further comprising:
    a source contact pad coupled to the first source; and
    a drain contact pad coupled to the first drain, wherein the source contact pad and the drain contact pad are disposed over the opposite sides of the substrate.

11. The switching device of claim 1, further comprising:
    a second opening disposed in the substrate;
    a second source disposed adjacent the second opening and having a contact surface parallel to sidewalls of the second opening;
    a second drain disposed adjacent the second opening and having a contact surface parallel to sidewalls of the second opening; and
    a second moveable gate stack comprising a second channel and a second gate disposed within the second opening.

12. The switching device of claim 11, wherein the first source and the second source are coupled to a common source node, and wherein the first drain and the second drain are coupled to a common drain node.

13. The switching device of claim 11, wherein the first source and the second source are separated by a common region of the substrate.

14. A switching device comprising:
    an opening disposed in a substrate comprising a major surface, the opening extending into the substrate along a first direction from the major surface, the opening further comprising a first sidewall and an opposite second sidewall;
    a source disposed in and/or over the opening;
    a drain disposed in and/or over the opening; and
    a channel disposed in the opening, the channel comprising a first moveable conductive element having a first position and a second position, wherein, in the first position, the first moveable conductive element is configured to contact the drain and the source, wherein, in the second position, the first moveable conductive element is configured to be separated from the drain and the source by a first air gap, wherein, in the first position, the switching device is configured to conduct a current parallel to the first direction, wherein, in a side view along a plane parallel to the first sidewall, a surface area of the channel is smaller than a surface area of the gate.

15. The switching device of claim 14, further comprising:
    a dielectric layer disposed over the source, the dielectric layer comprising a first major surface and an opposite second major surface;
    a second air gap disposed between the source and the dielectric layer; and
    a gate disposed along the first major surface of the dielectric layer.

16. The switching device of claim 15, wherein the channel is disposed along the second major surface of the dielectric layer.

17. The switching device of claim 14, wherein the source disposed along a first portion of the first sidewall of the opening, wherein the drain comprising a first drain region disposed along a second portion of the first sidewall of the opening, wherein the source is further disposed along a first portion of the second sidewall of the opening, wherein the drain further comprises a second drain region disposed along a second portion of the second sidewall of the opening.

18. The switching device of claim 17, wherein the channel comprises a second moveable conductive element having a first position and a second position, wherein, in the first position, the second moveable conductive element is configured to contact the second drain region and the source, wherein, in the second position, the second moveable conductive element is configured to be separated from the second drain region and the source by a second air gap.

19. The switching device of claim 17, wherein the channel is mechanically coupled to a gate anchored to a bottom surface of the opening.

20. The switching device of claim 14, wherein the substrate comprises a semiconductor or a metallic substrate.

21. The switching device of claim 20, further comprising an isolating dielectric layer disposed over the major surface of the substrate, wherein the source is electrically isolated from the drain by the isolating dielectric layer.

22. An integrated circuit comprising:
a plurality of switching devices, wherein each switching device of the plurality of switching devices comprise:
an opening disposed in a substrate comprising a major surface, the opening extending into the substrate along a first direction from the major surface,
a source region,
a drain region,
a gate line oriented along a first direction,
a moveable conductive element disposed within the opening and attached to the gate line, wherein the moveable conductive element is configured to contact the source region and the drain region in a first state of the switching device and configured to be isolated from the source region and the drain region in a second state of the switching device,
wherein the plurality of switching devices are arranged in rows along the first direction and columns along a second direction perpendicular to the first direction, wherein a first gate line of one of the plurality of switching devices is coupled to an adjacent second gate line of another of the plurality of switching devices in the same row by a conductive line in a metal level above the first gate line, wherein each of the plurality of switching devices comprises an ON state and an OFF state, and wherein, in the ON state, each of the plurality of switching devices is configured to conduct a current parallel to the first direction.

23. The circuit of claim 22, wherein the first gate line is coupled to an adjacent third gate line in the same column by a conductive line in a same level as the first gate line.

24. The circuit of claim 22, wherein the opening is rectangular.

25. The circuit of claim 22, wherein the integrated circuit comprises a CMOS device.

26. The circuit of claim 22, wherein the integrated circuit comprises a memory device.

27. The circuit of claim 22, wherein each switching device of the plurality of switching devices further comprise:
springs coupled to the moveable conductive element.

28. The circuit of claim 22, wherein each switching device of the plurality of switching devices is capped with an cap.

29. The circuit of claim 28, wherein the cap is separated from the switching device by an interposer.

30. The circuit of claim 22, wherein each switching device of the plurality of switching devices further comprise:
a second moveable conductive element disposed in the opening and attached to the gate line, the moveable conductive element and the second moveable conductive element disposed along opposite sides of the opening.

31. The circuit of claim 22, wherein the moveable conductive element overlaps the source region in a first overlap area and the moveable conductive element overlaps the drain region in a second overlap area, wherein the first overlap area is different from the second overlap area.

32. The circuit of claim 22, wherein the source region comprises a first thickness along a vertical direction towards the substrate, wherein the drain region comprises a second thickness along the vertical direction, wherein the first thickness is different from the second thickness.

* * * * *